(12) United States Patent
Anderson et al.

(10) Patent No.: US 9,064,943 B1
(45) Date of Patent: Jun. 23, 2015

(54) GATE-ALL-AROUND FIELD EFFECT TRANSISTOR STRUCTURES AND METHODS

(71) Applicant: International Business Machines Corporation, Armonk, NY (US)

(72) Inventors: Brent A. Anderson, Jericho, VT (US); Edward J. Nowak, Essex Junction, VT (US); Yan Zhang, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/502,487

(22) Filed: Sep. 30, 2014

(51) Int. Cl.
*H01L 29/66* (2006.01)
*H01L 29/772* (2006.01)

(52) U.S. Cl.
CPC .................................. *H01L 29/772* (2013.01)

(58) Field of Classification Search
CPC .......................... H01L 29/772; H01L 29/7801
USPC .......................................... 257/262, 263, 264
See application file for complete search history.

(56) References Cited

U.S. PATENT DOCUMENTS

| | | | |
|---|---|---|---|
| 7,074,662 B2 | 7/2006 | Lee et al. | |
| 7,456,476 B2 | 11/2008 | Hareland et al. | |
| 7,655,522 B2 | 2/2010 | Kim et al. | |
| 7,800,166 B2 | 9/2010 | Doyle et al. | |
| 7,893,487 B2 | 2/2011 | Lee et al. | |
| 7,947,543 B2 | 5/2011 | Kim | |
| 8,110,871 B2 | 2/2012 | Lee et al. | |
| 8,541,274 B1 | 9/2013 | Xie et al. | |
| 2014/0061792 A1 | 3/2014 | Bu et al. | |

OTHER PUBLICATIONS

S. Bangsaruntip et al., "Density scaling with gate-all-around silicon nanowire MOSFETs for the 10 nm node and beyond," IEEE International Electron Devices Meeting (IEDM), 2013, pp. 20.2.1-20.2.4.

*Primary Examiner* — Tan N Tran
(74) *Attorney, Agent, or Firm* — Gibb & Riley, LLC; Michael J. LeStrange, Esq.

(57) ABSTRACT

Disclosed are gate-all-around (GAA) field effect transistors (FETs) and methods of forming them. In one GAAFET, a semiconductor body is on an insulator layer. A gate wraps around the semiconductor body (i.e., is adjacent to the top, bottom and opposing sides of the semiconductor body) at a channel region with a lower portion of the gate being in a cavity in the insulator layer. In another GAAFET, multiple semiconductor bodies are on an insulator layer. A gate wraps around and extends between the semiconductor bodies at channel regions with a lower portion of the gate being contained in a cavity in the insulator layer. To reduce gate resistance and gate-to-source/drain contact capacitance, the lower portion extends a greater distance below the bottom(s) of the semiconductor body(ies) than the upper portion extends above the top(s). To further reduce gate resistance, the length and width of the lower portion increases from the top surface of the insulator layer downward.

20 Claims, 28 Drawing Sheets

GATE-ALL-AROUND FIELD EFFECT TRANSISTOR STRUCTURES AND METHODS

BACKGROUND

The present disclosure relates to field effect transistors and, more specifically, to gate-all-around field effect transistors (GAAFETs) and method of forming these GAAFETs.

More specifically, integrated circuit design decisions are often driven by device scalability. For example, size scaling of planar field effect transistors (FETs) resulted in the development of planar FETs with relatively short channel lengths; however, the smaller channel lengths resulted in a corresponding increase in short channel effects and a decrease in drive current. To decrease short channel effects and increase drive current, different types of multi-gate non-planar field effect transistors (MUGFETs), such as fin-type FETs (FIN-FETs) (also referred to herein as a dual gate FETs) and tri-gate FETs, were developed. A FINFET is a MUGFET comprising a relatively thin semiconductor body (also referred to as a semiconductor fin) having a channel region positioned laterally between source/drain regions. A gate stack is adjacent to the top surface and opposing sides of the semiconductor body at the channel region. Since the semiconductor body of this FINFET is relatively thin, the FINFET essentially exhibits only two-dimensional field effects. That is, since its semiconductor body is relatively thin, a FINFET will exhibit field effects at the opposing sides of the channel region, but any field effects exhibited at the top surface of the channel region will be negligible. A tri-gate FET is a MUGFET that is similar in structure to a FINFET, except it has a relative wide semiconductor body and, thus, it exhibits three-dimensional field effects. That is, since its semiconductor body is relative wide, a tri-gate FET will exhibit field effects at the opposing sides and top surface of the channel region. Oftentimes, multiple semiconductor bodies and/or multiple gate stacks will be incorporated into a given MUGFET structure in order to increase drive current as well as device density. However, with conventional methods of forming such MUGFETS, further size scaling causes increases in gate resistance and gate-to-source/drain contact capacitance, which negatively impact device performance. Therefore, there is a need in the art for improved field effect transistor (FET) structures and methods of forming the structures that allow for further size scaling, while avoiding corresponding increases in gate resistance and gate-to-source/drain contact capacitance.

SUMMARY

Disclosed herein is a GAAFET that incorporates multiple semiconductor bodies. This GAAFET can similarly comprise an insulator layer and a cavity at the top surface of the insulator layer. This GAAFET can further comprise multiple semiconductor bodies, wherein each semiconductor body comprises source/drain regions and a channel region positioned laterally between the source/drain regions. The semiconductor bodies can be arranged in parallel on the insulator layer and can traverse the cavity such that the channel regions of the semiconductor bodies are aligned above the cavity and such that the source/drain regions of the semiconductor bodies extend beyond the cavity. This GAAFET can further comprise a gate having a lower portion and an upper portion. The lower portion of the gate can be contained within the cavity in the insulator layer (i.e., recessed within the insulator layer) such that it extends between the semiconductor bodies and is adjacent to the bottoms of the semiconductor bodies at their channel regions. The upper portion of the gate can be above the lower portion and, particularly, can be extend between the semiconductor bodies and can be adjacent to the tops and opposing sides the semiconductor bodies at their channel regions. To reduce gate resistance and gate-to-source/drain contact capacitance in each of the GAAFETs described above, the lower portion of the gate can extend a greater distance below the bottom(s) of the semiconductor body(ies) than the upper portion of the gate extends above the top(s) of the semiconductor body(ies).

Also disclosed herein is a method of forming a GAAFET that incorporates a single semiconductor body. This method can comprise forming a semiconductor body on the top surface of an insulator layer, wherein the semiconductor body comprises source/drain regions and a channel region positioned laterally between the source/drain regions. A dummy gate can be formed adjacent to the top and opposing sides of the semiconductor body at the channel region. After the dummy gate is formed, a dielectric layer can be formed over the insulator layer, over the source/drain regions of the semiconductor body and over the dummy gate. Subsequently, the dummy gate can be selectively removed so as to form, in the dielectric layer, an opening that exposes the top and the opposing sides of the semiconductor body at the channel region as well as portions of the insulator layer adjacent to the opposing sides of the semiconductor body at the channel region. Next, the exposed portions of the insulator layer within the opening in the dielectric layer can be etched and this etch process can be continued until a cavity, which is aligned below the bottom of the semiconductor body at the channel region, is formed. Once the cavity is formed, a gate (e.g., a replacement metal gate) can be formed such that a lower portion of the gate fills the cavity in the insulator layer and an upper portion of the gate fills the opening in the dielectric layer. Thus, the lower portion of the gate will be aligned below and adjacent to the bottom of the semiconductor body at the channel region and the upper portion of the gate will be above the lower portion and, particularly, adjacent to the top and the opposing sides of the semiconductor body at the channel region.

Also disclosed herein is a method of forming a GAAFET that incorporates multiple semiconductor bodies. This method can comprise forming multiple semiconductor bodies on the top surface of an insulator layer, wherein each of the semiconductor bodies comprises source/drain regions and a channel region positioned laterally between the source/drain regions.

A dummy gate can be formed such that it traverses the semiconductor bodies and, particularly, such that it is adjacent to the top and opposing sides of each of the semiconductor bodies at their channel regions and such that it extends laterally between the semiconductor bodies at their channel regions. After the dummy gate is formed, a dielectric layer can be formed over the insulator layer, over the source/drain regions of the semiconductor bodies and over the dummy gate. Subsequently, the dummy gate can be selectively removed so as to form, in the dielectric layer, an opening that exposes the tops and the opposing sides of the semiconductor bodies at their channel regions as well as portions of the insulator layer adjacent to the opposing sides of the semiconductor bodies at the channel regions. Next, the exposed portions of the insulator layer within the opening in the dielectric layer can be etched and this etch process can be continued until a cavity is formed that is aligned below the bottoms of the semiconductor bodies and extends between the semiconductor bodies at their channel regions. Once the cavity is formed a gate (e.g., a replacement metal gate) can be formed such that a lower portion of the gate fills the cavity in the insulator layer and an upper portion of the gate fills the opening in the dielectric layer. Thus, the lower portion of the gate will be aligned below and adjacent to the bottoms of the semiconductor bodies at their channel regions and the upper portion of the gate will be above the lower portion and, particularly, adjacent to the tops and opposing sides of the semiconductor bodies at their channel regions.

It should be noted that, in each of the above-described methods, the process of etching the exposed portions of the insulator layer to form the cavity and the process of forming the gate can be tailored in order to reduce gate resistance and gate-to-source/drain contact capacitance. For example, to reduce gate resistance and gate-to-source/drain contact capacitance, these processes can be performed such that the lower portion of the gate extends a greater distance below the bottom(s) of the semiconductor body(ies) than the upper portion of the gate extends above the top(s) of the semiconductor body(ies).

BRIEF DESCRIPTION OF THE DRAWINGS

The embodiments herein will be better understood from the following detailed description with reference to the drawings, which are not necessarily drawn to scale and in which.

DETAILED DESCRIPTION

As mentioned above, there is a need in the art for improved field effect transistor (FET) structures and methods of forming such structures that allow for further size scaling, while avoiding corresponding increases in gate resistance and gate-to-source/drain contact capacitance. In view of the foregoing, disclosed herein are gate-all-around field effect transistors (GAAFETs), including a GAAFET incorporating a single semiconductor body and a GAAFET incorporating multiple semiconductor bodies, and methods of forming the GAAFETs. In one GAAFET, a semiconductor body, which comprises source/drain regions and a channel region between the source/drain regions, can be on the top surface of an insulator layer. A gate can wrap entirely around the semiconductor body at the channel region (i.e., can be adjacent to the top, bottom and opposing sides of the semiconductor body at the channel region) with a lower portion of the gate being contained in a cavity in the insulator layer. In another GAAFET, multiple semiconductor bodies, which each comprise source/drain regions and a channel region between the source/drain regions, can be on the top surface of an insulator layer. A gate can wrap entirely around each of the semiconductor bodies and can extend between the semiconductor bodies at the channel regions with a lower portion of the gate being contained in a cavity in the insulator layer. To reduce gate resistance and gate-to-source/drain contact capacitance, the lower portion of the gate can extend a greater distance below the bottom(s) of the semiconductor body(ies) than the upper portion of the gate extends above the top(s) of the semiconductor body(ies). To further reduce gate resistance, the length and width of the cavity and, thereby the length and width of the lower portion of the gate can increase from the top surface of the insulator layer downward.

Figure 1A:
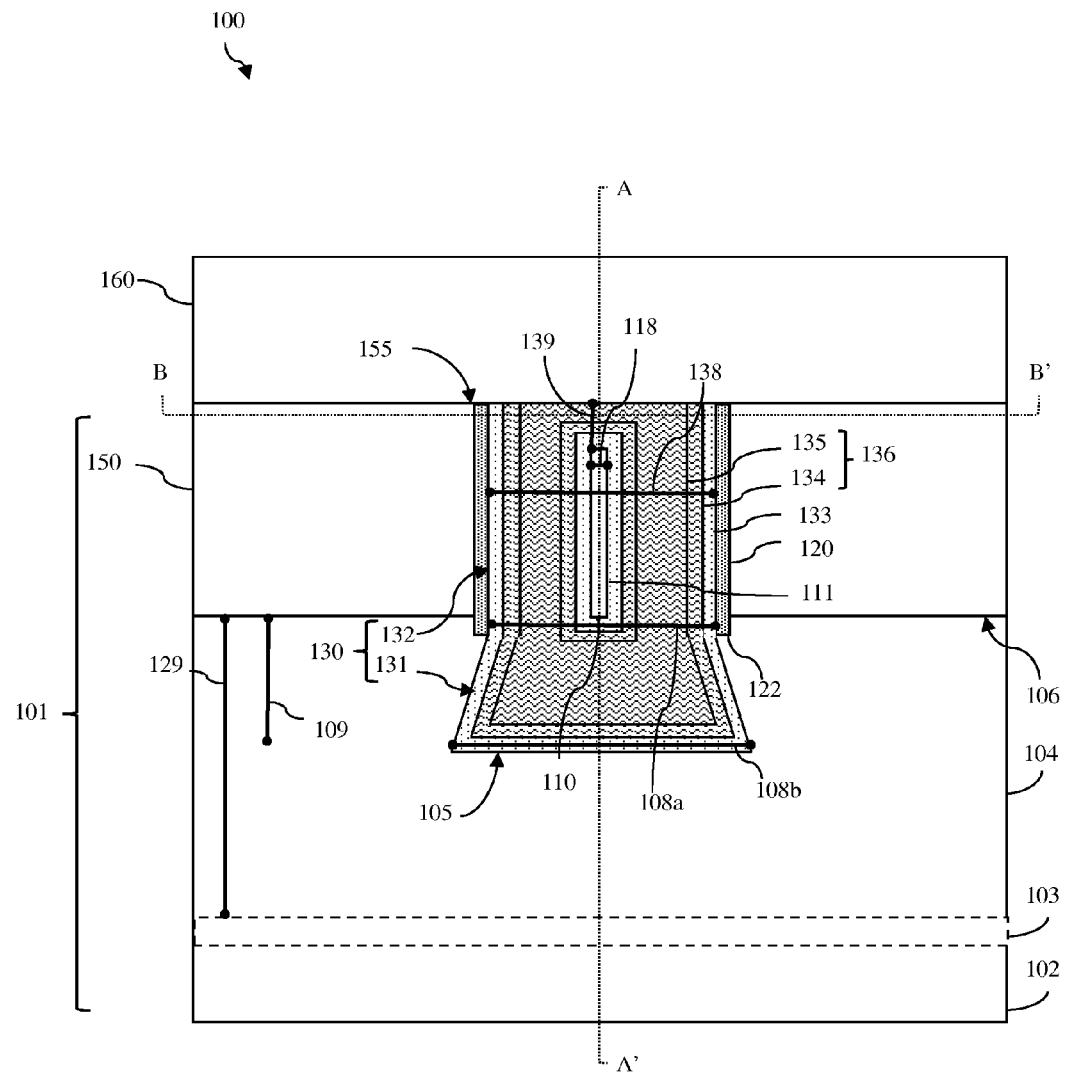
FIG. 1A is a cross-section illustration of GAAFET through a vertical plane that cuts across the width of the GAAFET.
Figure 1B:
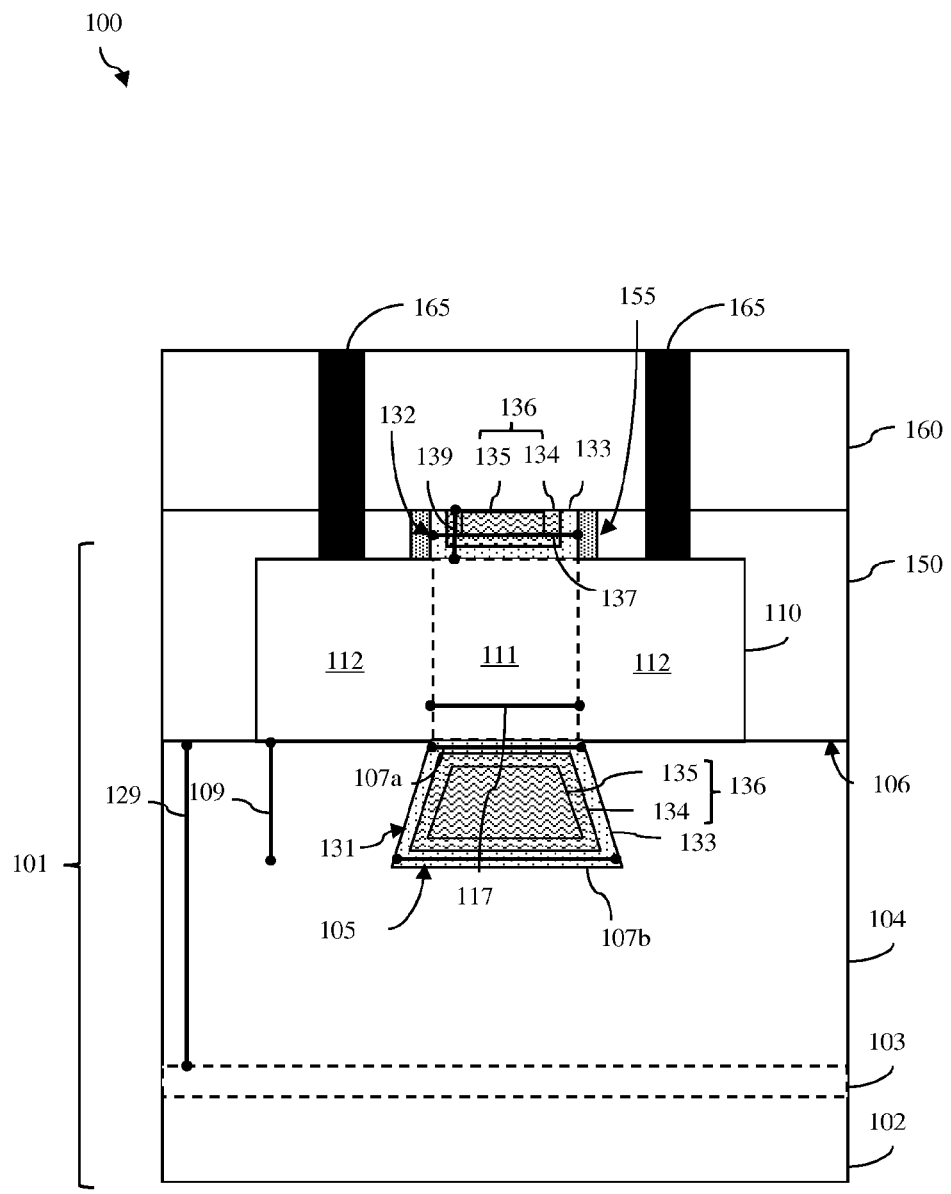
FIG. 1B is another cross-section illustration of the GAAFET of FIG. 1A through a different vertical plane A-A', as shown in FIG. 1A, cuts across the length of the GAAFET.
Figure 1C:
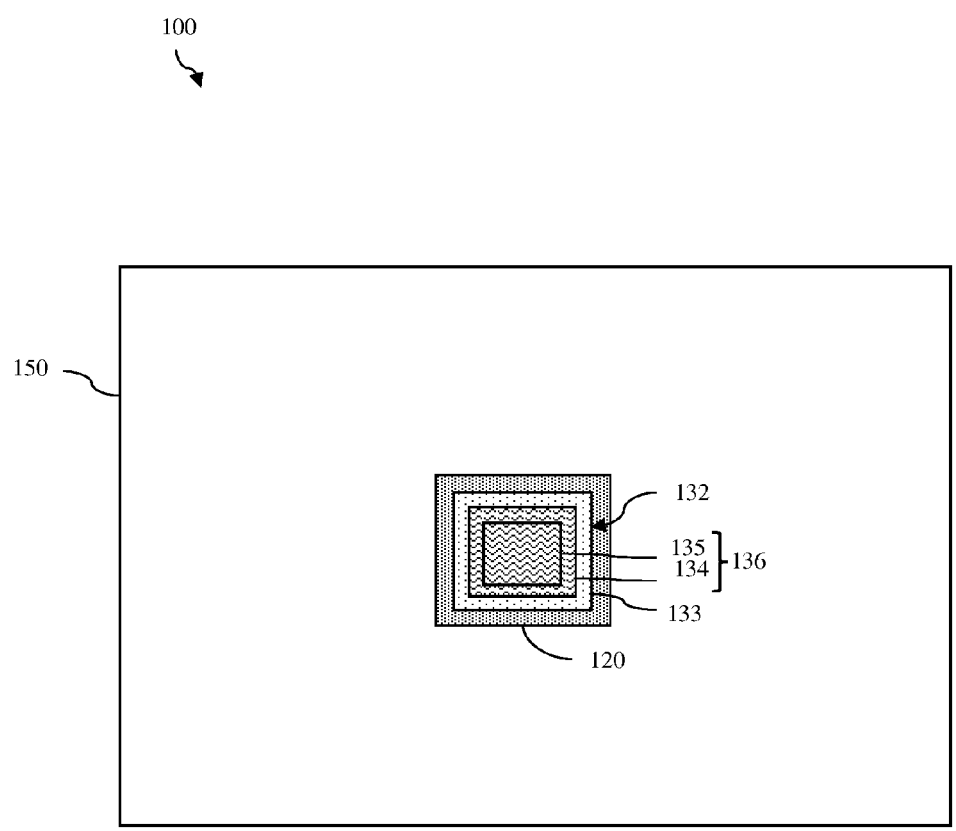
FIG. 1C is yet another cross-section illustration of the GAAFET of FIG. 1A through a horizontal plane B-B', as shown in FIG. 1A.
Figure 2A:
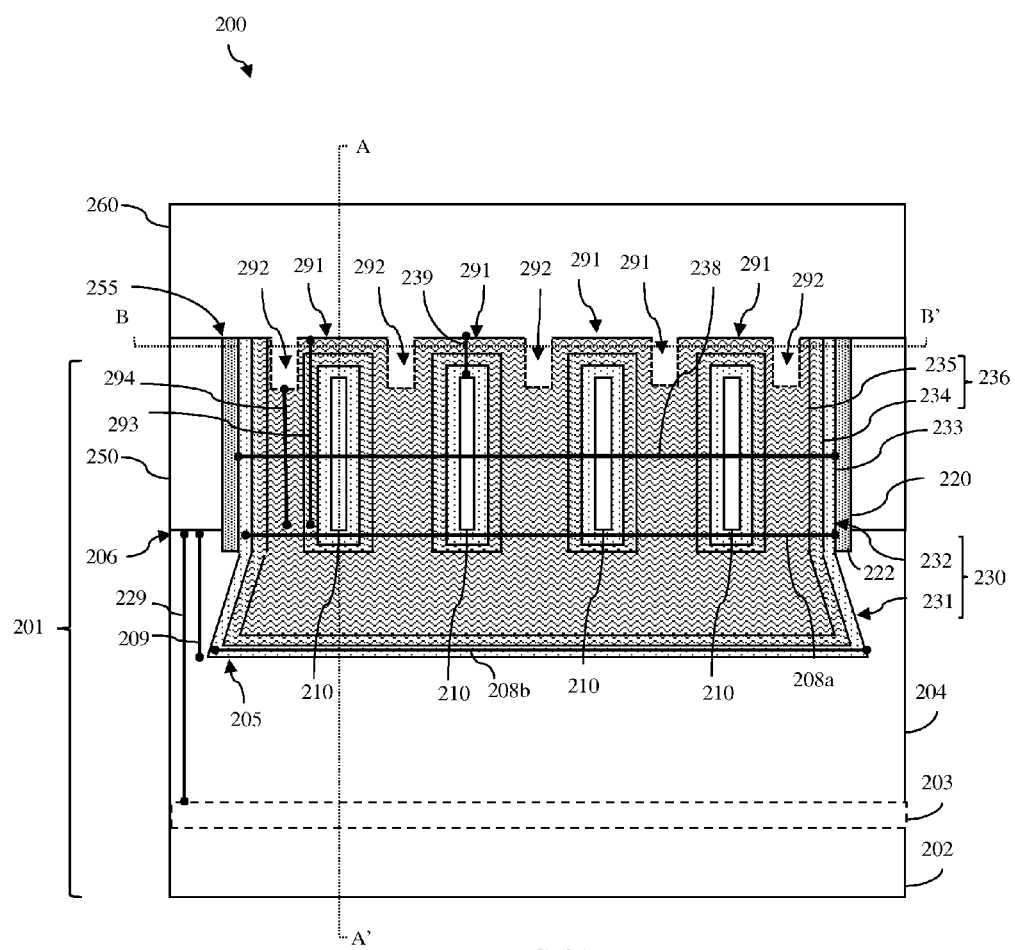
FIG. 2A is a cross-section illustration of a GAAFET through a vertical plane, which cuts across the width of the GAAFET.
Figure 2B:
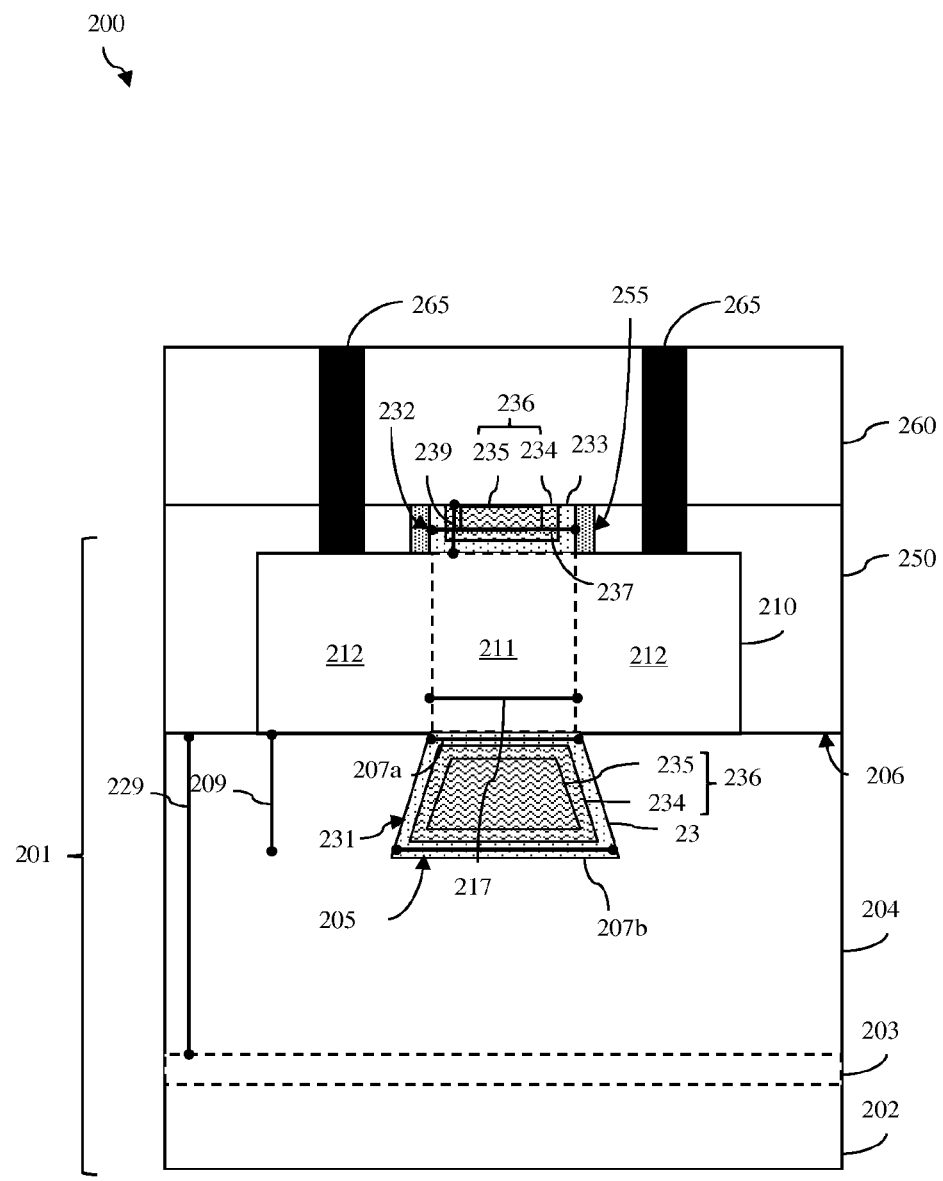
FIG. 2B is another cross-section illustration of the GAAFET of FIG. 1A through a different vertical plane A-A', which, as shown in FIG. 2A, cuts across the length of the GAAFET.
Figure 2C:
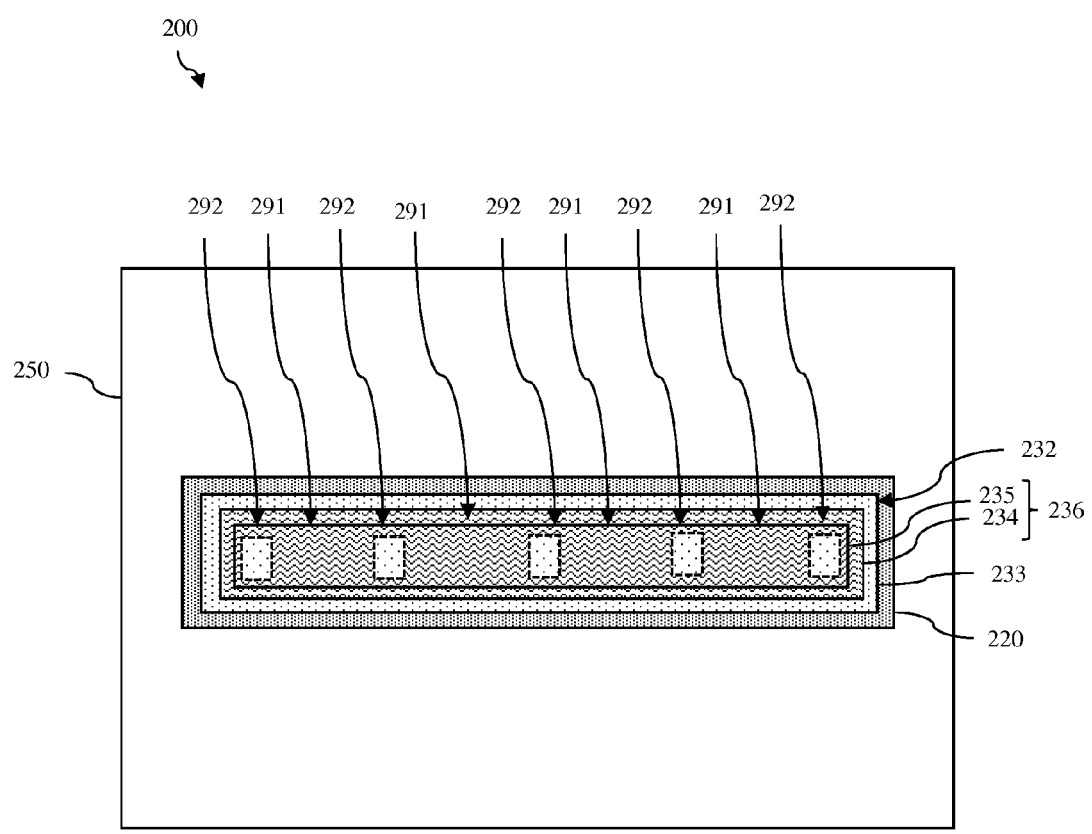
FIG. 2C is yet another cross-section illustration of the GAAFET of FIG. 2A through a horizontal plane B-B', as shown in FIG. 2A.

More particularly, disclosed herein are GAAFETs 100, 200 that incorporate one or more semiconductor bodies (e.g., a single semiconductor body 110, as shown in the GAAFET 100 of FIGS. 1A-1C, or multiple semiconductor bodies 210, as shown in the GAAFET 200 of FIGS. 2A-2C). The GAAFETs 100, 200 can be formed on a semiconductor-oninsulator (SOI) wafer 101, 201. Thus, the GAAFETs 100, 200 can comprise a semiconductor substrate 102, 202 (e.g., a silicon substrate or any other suitable semiconductor substrate, such as a germanium substrate, a gallium arsenide substrate, a gallium nitride substrate, etc.). The GAAFETs 100, 200 can further comprise an insulator layer 104, 204 (e.g., a silicon dioxide layer, a silicon nitride layer, a silicon oxynitride layer or any other suitable insulator layer) on the substrate 102, 202 and a semiconductor layer on the insulator layer 104, 204. Optionally, the GAAFETs 100, 200 can further comprise an additional insulator layer 103, 203 between the substrate 102, 202 and the insulator layer 104, 204. This additional insulator layer 103, 203 can comprise a different insulator material than the insulator layer 104, 204 and, particularly, can comprise an insulator material having a lower thermal resistance than the insulator material of the insulator layer 104, 204. Thus, for example, the additional insulator layer 103, 203 can comprise aluminum oxide or any other suitable relatively low thermal resistance insulator material.

The GAAFET 100 can further comprise a non-planar semiconductor body 110 (i.e., a rectangular or fin-shaped semiconductor body, also referred to herein as a semiconductor fin) above and immediately adjacent to the insulator layer 104. The GAAFET 200 can further comprise multiple non-planar semiconductor bodies 210 (i.e., multiple rectangular or fin-shaped semiconductor bodies, also referred to herein as a semiconductor fins) above and immediately adjacent to the insulator layer 204. For illustration purposes four semiconductor bodies 210 are shown in the GAAFET 200 of FIG. 2A. However, it should be understood that the GAAFET 200 could, alternatively, incorporate any number of two or more semiconductor bodies 210. In any case, in the GAAFETs 100, 200, the semiconductor body(ies) 110, 210 can each comprise at least source/drain regions 112, 212 and a channel region 111, 211 positioned laterally between the source/drain regions 112, 212. The source/drain regions 112, 212 can have a first type conductivity at a relatively high conductivity level. The channel region 111, 211 can have, for example, a second type conductivity that is different from the first type conductivity. Although not shown, the semiconductor body(ies) 110, 210 can each comprise one or more additional regions including, but not limited to, halo region(s) (e.g., with the same second type conductivity as the channel region 111, 211 but at a higher conductivity level) and source/drain extension region(s) (e.g., with the same first type conductivity as the source/drain regions 112, 212 but at a lower conductivity level). The incorporation of halo region(s) and/or source/drain regions either symmetrically or asymmetrically with a semiconductor body of a field effect transistor is well known in the art and, thus, the details of such regions are omitted from this specification in order to allow the reader to focus on the salient aspects of the disclosed GAAFETs 100, 200.

It should be noted that the first type conductivity and the second type conductivity will vary depending upon whether the GAAFET 100, 200 is an N-type GAAFET or a P-type GAAFET. For example, for an N-type GAAFET, the first type conductivity of the source/drain regions can be N-type conductivity and the second type conductivity (e.g., of the channel region) can be P-type conductivity, whereas, for a P-type GAAFET, the first type conductivity of the source/drain regions can be P-type conductivity and the second type conductivity (e.g., of the channel region) can be N-type conductivity. Those skilled in the art will recognize that different dopants can be used to achieve the different type conductivities (i.e., P-type conductivity and N-type conductivity) in the different regions of the semiconductor body(ies) and that those dopants will vary depending upon the different semiconductor materials used. For example, a silicon-based semiconductor material can be doped with arsenic (As), phosphorous (P) or antimony (Sb) so as to have N-type conductivity or can be doped with boron (B), boron difluoride ($BF_2$) or indium (In) so as to have P-type conductivity. In another example, a gallium arsenide (GaAs) or gallium nitride (GaN)-based semiconductor material can be doped with silicon (Si) so as to have N-type conductivity or can be doped with magnesium (Mg) or beryllium (Be) so as to have P-type conductivity. Additionally, those skilled in the art will also recognize that the higher the concentration of the particular dopant used, the higher the conductivity level associated with that dopant and vice versa. Furthermore, the different conductivity types and levels will depend upon the relative concentration levels of different type dopants in the same region.

The GAAFETs 100, 200 can further comprise a cavity 105, 205 in and at the top surface 106, 206 of the insulator layer 104, 204. In the GAAFET 100, the cavity 105 can be wider than the semiconductor body 110 (e.g., the width 108a of the cavity as measured at the interface between the cavity 105 and the top surface 106 of the insulator layer 104 can be greater than the width 118 of the semiconductor body 110) and the semiconductor body 110 can traverse the cavity 105 such that the channel region 111 is aligned above the cavity 105 and such that the source/drain regions 112 extend laterally beyond the cavity 105. In the GAAFET 200, each of the semiconductor bodies 210 can traverse the cavity 205 such that the channel regions 211 of those semiconductor bodies 210 are aligned above the cavity 205, such that the source/drain regions 212 of those semiconductor bodies 210 extend laterally beyond the cavity 205, and such that portions of the cavity 205 extend laterally beyond the opposing sides of the semiconductor bodies 210 and, particularly, between adjacent semiconductor bodies 210 at their channel regions 211.

The GAAFETs 100, 200 can further comprise at least one dielectric layer 150, 250 covering the insulator layer 104, 204 and the semiconductor body(ies) 110, 210. This dielectric layer 150, 250 can comprise one or more layers of conventional interlayer dielectric material (e.g., silicon dioxide, silicon nitride, silicon oxynitride, borophosphosilicate glass (BPSG), phosphosilicate glass (BPSG), boron silicate glass (BSG), undoped silicate glass (USG), etc.). An opening 155, 255 can extend vertically through the dielectric layer 150, 250 to the insulator layer 104, 204 and can be aligned vertically above the cavity 105, 205 such that the channel region(s) 111, 211 of the semiconductor body(ies) 110, 210 is/are contained within the opening 155, 255 and such that the source/drain regions 112, 212 of the semiconductor body(ies) remain covered by the dielectric layer 150, 250. Vertical sidewalls of the dielectric layer 150, 250 within the opening 155, 255 can be lined with a gate sidewall spacer 120, 220. The gate sidewall spacer 120, 220 can comprise one or more dielectric layers (e.g., silicon dioxide, silicon nitride, silicon oxynitride, air-gaps, etc.). The material used for the gate sidewall spacer 120, 220 should be different than that used for the insulator layer 104, 204 so that, during processing, the insulator layer 104, 204 can be selectively etched over the gate sidewall spacer 120, 220.

The GAAFETs 100, 200 can further comprise a gate 130, 230 having a lower portion 131, 231 and an upper portion 132, 232. The lower portion 131, 231 can be contained within the cavity 105, 205 (i.e., recessed within the insulator layer 104, 204). The upper portion 132, 232 can be above the lower portion 131, 231 and, particularly, can be contained within the opening 155, 255 in the dielectric layer 150, 250 such that it is laterally surrounded by the gate sidewall spacer 120, 220. Thus, in the GAAFET 100, the lower portion 131 is adjacent to the bottom of the semiconductor body 110 at the channel region 111 and the upper portion 132 is adjacent to the top and opposing sides of the semiconductor body 110 at the channel region 111. In the GAAFET 200, the lower portion 231 is adjacent to the bottoms of the semiconductor bodies 210 at their channel regions 211, the upper portion 232 is adjacent to the tops and opposing sides of the semiconductor bodies 210 at their channel regions 211, and both the lower and upper portions 231-232 extend laterally between the semiconductor bodies 210 at their channel regions 211. In any case, the gate 130, 230 can comprise a gate dielectric 133, 233 that is immediately adjacent to the bottom(s), top(s) and opposing sides of the semiconductor body(ies) 110, 210 at the channel region(s) 111, 211 (i.e., that wraps entirely around the semiconductor body(ies) 110, 210 at the channel region(s) 111, 211). The gate 130, 230 can further comprise a gate conductor 136, 236 that is immediately adjacent to the gate dielectric 133, 233 such that it similarly wraps entirely around the semiconductor body(ies) 110, 210 at the channel region(s) 111, 211 and further fills the cavity 105, 205 and opening 155, 255.

The gate 130, 230 can, for example, comprise a replacement metal gate. In a replacement metal gate, the gate dielectric 133, 233 can comprise a conformal high-K gate dielectric layer. The conformal high-K dielectric layer can be immediately adjacent to the top(s), bottom(s) and opposing sides of the semiconductor body(ies) 110, 210 at the channel region(s) 111, 211. The conformal high-K dielectric layer can further line the cavity 105, 205 and cover the gate sidewall spacer 120, 220 in the opening 155, 255. The high-K gate dielectric layer can comprise, for example, a hafnium (Hf)-based dielectric layer (e.g., hafnium oxide, hafnium silicon oxide, hafnium silicon oxynitride, hafnium aluminum oxide, etc.) or some other suitable high-K dielectric layer (e.g., aluminum oxide, tantalum oxide, zirconium oxide, etc.). In a replacement metal gate, the gate conductor 136, 236 can comprise multiple gate conductor layers including, for example, a first metal layer 134, 234 and a second metal layer 135, 235. The first metal layer 134, 234 can cover the high-K gate dielectric layer and can comprise a metal selected so as to have a specific work function appropriate for a given type FET (e.g., an N-type FET or a P-type FET). For example, for a silicon-based N-type FET, the first metal layer 134 can comprise, for example, hafnium, zirconium, titanium, tantalum, aluminum, or alloys thereof, such as hafnium carbide, zirconium carbide, titanium carbide, tantalum carbide, or aluminum carbide, so as to have a work function similar to that of N-doped polysilicon. For a silicon-based P-type FET, the first metal layer 134, 234 can comprise, for example, ruthenium, palladium, platinum, cobalt, or nickel, or a metal oxide (e.g., aluminum carbon oxide or aluminum titanium carbon oxide) or a metal nitride (e.g., titanium nitride, titanium silicon nitride, tantalum silicon nitride, titanium aluminum nitride, or tantalum aluminum nitride) so as to have a work function similar to that of P-doped polysilicon. The second metal layer 135, 235 can comprise, for example, a metal fill material (e.g., tungsten) that fills the remaining portion of the cavity 105, 205 and opening 155, 255. Alternatively, any other suitable configuration of metal and/or metal alloys could be used for the gate conductor 136, 236 of a replacement metal gate.

The GAAFETs 100, 200 can further comprise one or more additional dielectric layers 160, 260 above the dielectric layer 150, 250 and the upper portion 132, 232 of the gate 130, 230. The additional dielectric layer(s) 160, 260 can comprise one or more layers of conventional interlayer dielectric material. For example, the additional dielectric layer(s) 160, 260 can comprise the same interlayer dielectric material as that used for the dielectric layer 150, 250. Alternatively, the additional dielectric layer(s) 160, 260 can comprise a different interlayer dielectric material than that used for the dielectric layer 150, 250. Contacts 165, 265 can extend vertically through the additional dielectric layer(s) 160, 260 and dielectric layer 150, 250 to various components of the GAAFETs 100, 200 including, but not limited to, the source/drain regions 112, 212 (as shown in FIGS. 1B and 2B) and the upper portion 132, 232 of the gate 130, 230 (not shown).

To reduce gate-to-source/drain contact capacitance and to reduce gate resistance in the GAAFETs 100, 200, the cavity 105, 205 and, thereby the lower portion 131, 231 of the gate 130, 230 can extend a greater distance below the bottom(s) of the semiconductor body(ies) 110, 210 than the upper portion 132, 232 of the gate 130, 230 extends above the top(s) of the semiconductor body(ies) 110, 210. That is, the lower portion 131, 231 of the gate 130, 230 can extend a first distance 109, 209 below the bottom(s) of the semiconductor body(ies) 110, 210, the upper portion 132, 232 of the gate 130, 230 can extend a second distance 139, 239 above the top(s) of the semiconductor body(ies) 110, 210, and the first distance 109, 209 can be greater than the second distance 139, 239. For example, the first distance 109, 209 can be 1.25 to 5 times greater than the second distance 139, 239. To reduce gate-to-substrate capacitance and to ensure adequate electrical isolation between the gate 130, 230 and the semiconductor substrate 102, 202, the cavity 105, 205 and, thereby the lower portion 131, 231 of the gate 130, 230 should not extend entirely through the insulator layer 104, 204 (or, if present, through the additional insulator layer 103, 203). That is, the depth of the cavity 105, 205 and, particularly, the first distance 109, 209 that the lower portion 131, 231 of the gate 130, 230 extends into the insulator layer 104, 204 should be less than the thickness 129, 229 (e.g., less than ¾ the thickness 129, 229; less than ½ the thickness 129, 229) of the insulator layer 104, 204. Optionally, to further reduce gate-to-source/drain contact capacitance in the GAAFET 200, specifically, sections 292 of the upper portion 232 of the gate 230 between the semiconductor bodies 210 can be recessed, as shown in FIGS. 2A and 2C. That is, the upper portion 232 of the gate 230 can have first sections 291 adjacent to the semiconductor bodies 210 and second sections 292 that extend between the semiconductor bodies 210. The first sections 291 can have a first height 293 relative to the top surface 206 of the insulator layer 204 and the second sections 292 can have a second height 294, which is less than the first height 293, relative to the top surface of the insulator layer 204. Optionally, to further reduce gate resistance in the GAAFETs 100, 200, the size (i.e., the length and width) of the cavity 105, 205 and, thereby the size (i.e., length and width) of the lower portion 131, 231 of the gate 130, 230 can increase from the top surface 106, 206 of the insulator layer 104, 204 downward. That is, the length 107a, 207a of the cavity 105, 205 in the insulator layer 104, 204 and of the lower portion 131, 231 of the gate 130, 230 within that cavity 105, 205, as measured at the interface between the cavity 105, 205 and the semiconductor body(ies) 110, 210, can be approximately equal to the length 137, 237 of the opening 155, 255 in the dielectric layer 150, 250 and of the upper portion 132, 232 of the gate 130, 230 within that opening 155, 255, which is also approximately equal to the length 117, 217 of the channel region(s) 111, 211 (see FIGS. 1B and 2B). Additionally, the width 108a, 208a of the cavity 105, 205 in the insulator layer 104, 204 and of the lower portion 131, 231 of the gate 130, 230 within that cavity 105, 205, also as measured at the interface between the cavity 105, 205 and the semiconductor body(ies) 110, 210, can be approximately equal to the width 138, 238 of the opening 155, 255 in the dielectric layer 150, 250 and of the upper portion 132, 232 of the gate 130, 230 within that opening 155, 255 (see FIGS. 1A and 2A). Optionally, however, the sides of the cavity 105, 205 can be angled (as shown) or curved (i.e., not perpendicular relative to the top surface 106, 206 of the insulator layer 104, 204) such that the size (i.e., the length and width) of the cavity 105, 205 and lower portion 131, 231 of the gate 130, 230 increases from the top surface 106, 206 of the insulator layer 104, 204 downward to some maximum size (i.e., a maximum length 107b, 207b and maximum width 108b, 208b) at a depth below the top surface 106, 206 of the insulator layer 104, 204. The maximum length 107b, 207b of the cavity 105, 205 and lower portion 131, 231 of the gate 130, 230 can, for example, be 1.1 to 2 times greater than the length 137, 237 of the opening 155, 255 and upper portion 132, 232 of the gate 130, 230 and, thereby 1.1 to 2 times greater than the length 117, 217 of the channel region(s) 111, 211.

It should be noted that, optionally, the gate sidewall spacer 120, 220 can have a lower edge 122, 222 that extends vertically into the insulator layer 104, 204 (as illustrated in FIGS. 1A and 2A), as opposed to being on and immediately adjacent to the top surface 106, 206 of the insulator layer 104, 204. During processing and, particularly, during the process step used to form the cavity 105, 205, as discussed in greater detail below with regard to the method, the depth at which the lower edge 122, 222 of the gate sidewall spacer 120, 220 extends into the insulator layer 104, 204 can dictate the depth within the insulator layer 104, 204 at which the size (i.e., length and width) of the cavity 105, 205 and, thereby the size of the lower portion 131, 231 of the gate 130, 230 begins to increase relative to the size of the opening 155, 255 that contains the upper portion 132, 232 of the gate 130, 230. That is, the cavity 105, 205 and, thereby the lower portion 131, 231 of the gate 130, 230 contained therein can be approximately equal in size (i.e., in length and width) to the opening 155, 255 and, thereby the upper portion 132, 232 of the gate 130, 230 at the top surface 106, 206 of the insulator layer 104, 204, but can increase in size (i.e., in length and width) below the lower edge 122, 222 of the gate sidewall spacer 120, 220.

In the GAAFETs 100, 200 described above the dimensions of the non-planar semiconductor bodies 110, 210 can vary depending upon the desired field effects. For example, for purposes of illustration, the non-planar semiconductor body (ies) 110, 210 are shown in FIGS. 1A and 2A as being relatively thin such that essentially only two-dimensional field effects would be exhibited at the channel region(s) 111, 211 of the GAAFETs 100, 200 (i.e., any field effects at the top(s) or bottom(s) of the semiconductor body(ies) 110, 210 at the channel region(s) 111, 211 would be negligible). However, it should be understood that the Figures are not intended to be limiting and that the non-planar semiconductor body(ies) 110, 210 could, alternatively, be relatively thick such that four-dimensional field effects are exhibited at the channel region(s) 111, 211 of the GAAFETs 100, 200 (i.e., such that field effects are exhibited at the top(s), bottom(s) and opposing sides of the semiconductor body(ies) 110, 210 at the channel region(s) 111, 211).

Figure 3:
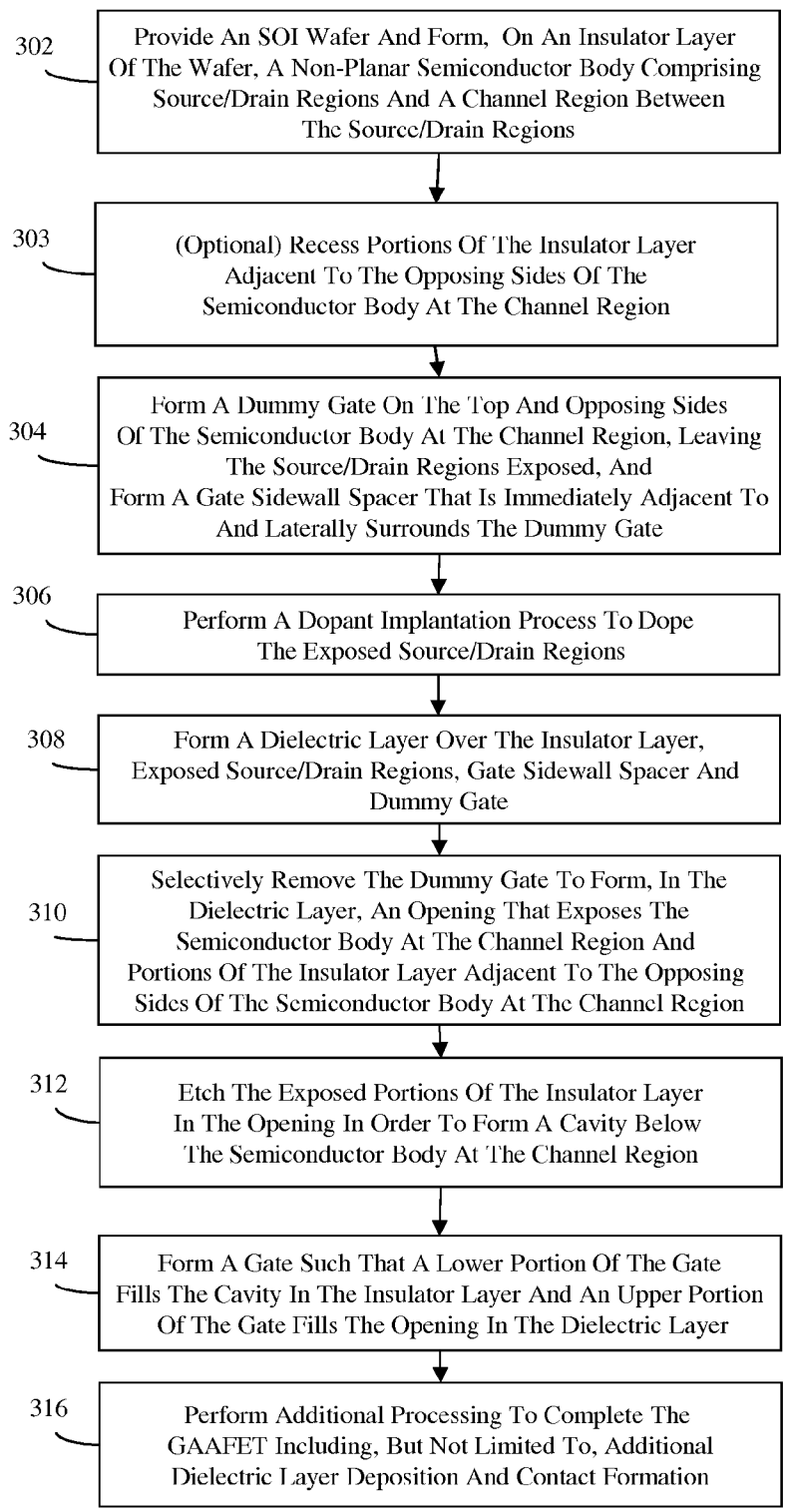
FIG. 3 is a flow diagram illustrating a method of forming the GAAFET of FIGS. 1A-1C.
Figure 4A:
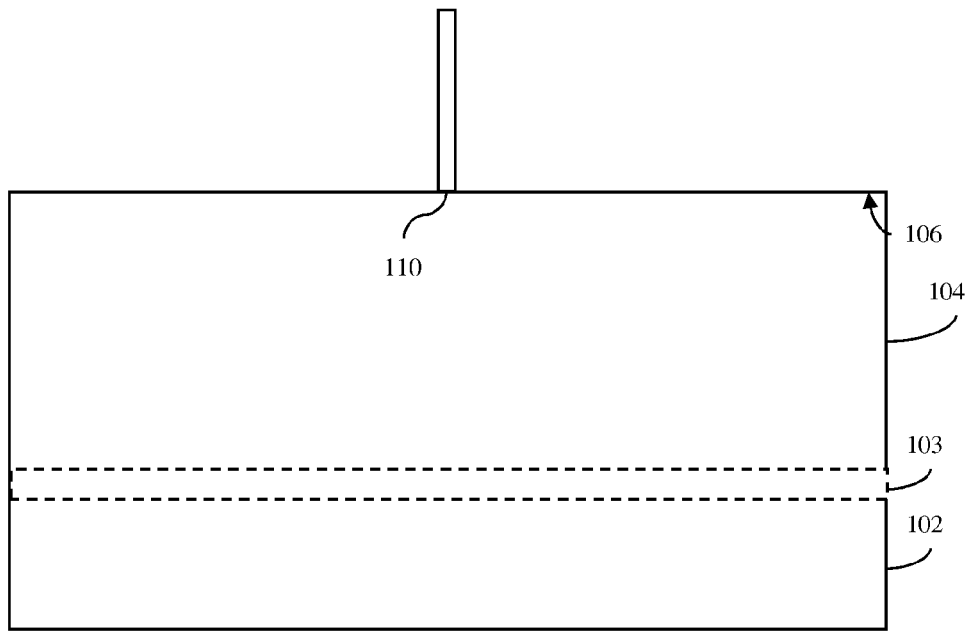
FIGS. 4A-B are cross-section and top view diagrams, respectively, of a partially completed GAAFET formed according to the method of FIG. 3.
Figure 4B:
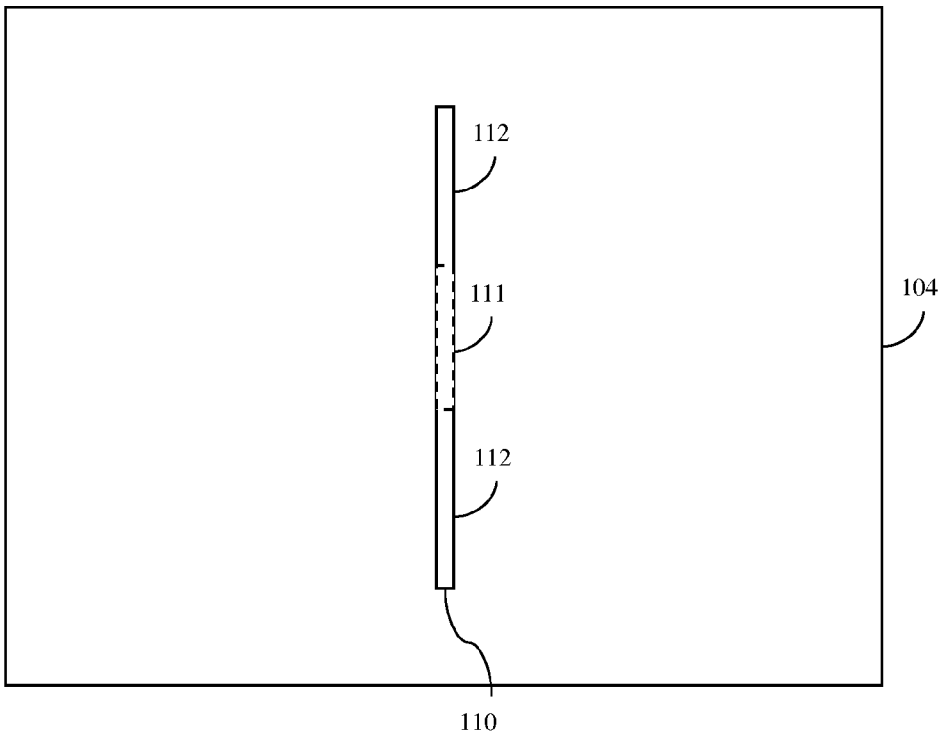

Referring to the flow diagram of FIG. 3, also disclosed herein is a method of forming the GAAFET 100, described above and illustrated in FIGS. 1A-1C. This method can comprise providing a semiconductor-on-insulator (SOI) wafer 101 and further forming a non-planar semiconductor body 110 from a semiconductor layer of that SOI wafer (302, see FIGS. 4A-4B). Specifically, the SOI wafer 101 can comprise a semiconductor substrate 102 (e.g., a silicon substrate or any other suitable semiconductor substrate, such as a germanium substrate, a gallium arsenide substrate, a gallium nitride substrate, etc.). This SOI wafer 101 can further comprise an insulator layer 104 (e.g., a silicon dioxide layer, a silicon nitride layer, a silicon oxynitride layer or any other suitable insulator layer) on the substrate 102 and a semiconductor layer on the insulator layer 104. Optionally, the SOI wafer 101 can further comprise an additional insulator layer 103 between the substrate 102 and the insulator layer 104. This additional insulator 103 can comprise a different insulator material than the insulator layer 104 and, particularly, can comprise an insulator material having a lower thermal resistance than the insulator material of the insulator layer 104. Thus, for example, the additional insulator layer 103 can comprise aluminum oxide or any other suitable relatively low thermal resistance insulator material. Using any one of various conventional techniques (e.g., a lithographic patterning and etch technique or a sidewall image transfer (SIT) technique), a non-planar semiconductor body 110 can be etched into the semiconductor layer such that the resulting semiconductor body 110 is on the top surface 106 of the insulator layer 104. This semiconductor body 110 can comprise source/drain regions 112 and a channel region 111 positioned laterally between the source/drain regions 112.

Figure 5:
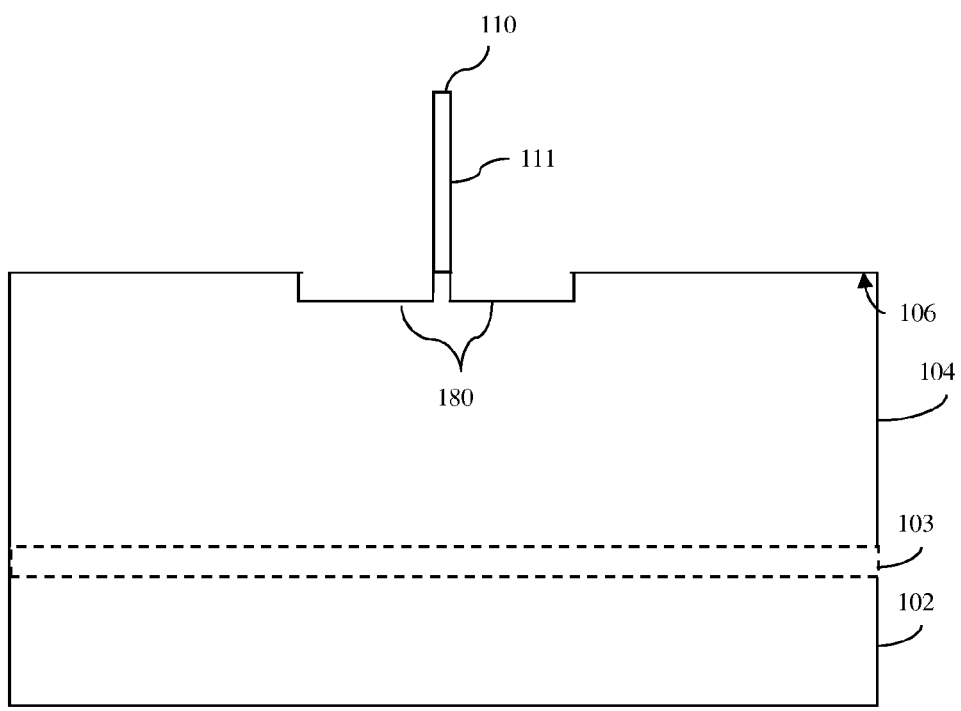
FIG. 5 is a cross-section diagram of a partially completed GAAFET formed according to the method of FIG. 3.

Optionally, after the semiconductor body 110 is formed, a mask layer can be formed over the semiconductor body 110. This mask layer can be patterned so as to have an opening that exposes the semiconductor body 110 at the channel region 111 and that further exposes portions 180 of the insulator layer 104 adjacent to the opposing sides of the semiconductor body 110 at the channel region 111. Next, an anisotropic etch process, which is selective for the insulator material of the insulator layer 104 over the semiconductor material of the semiconductor body 110, can be performed in order to recess the exposed portions 180 of the insulator layer 104 (303, see FIG. 5). Then, the mask layer can be removed.

Figure 6A:
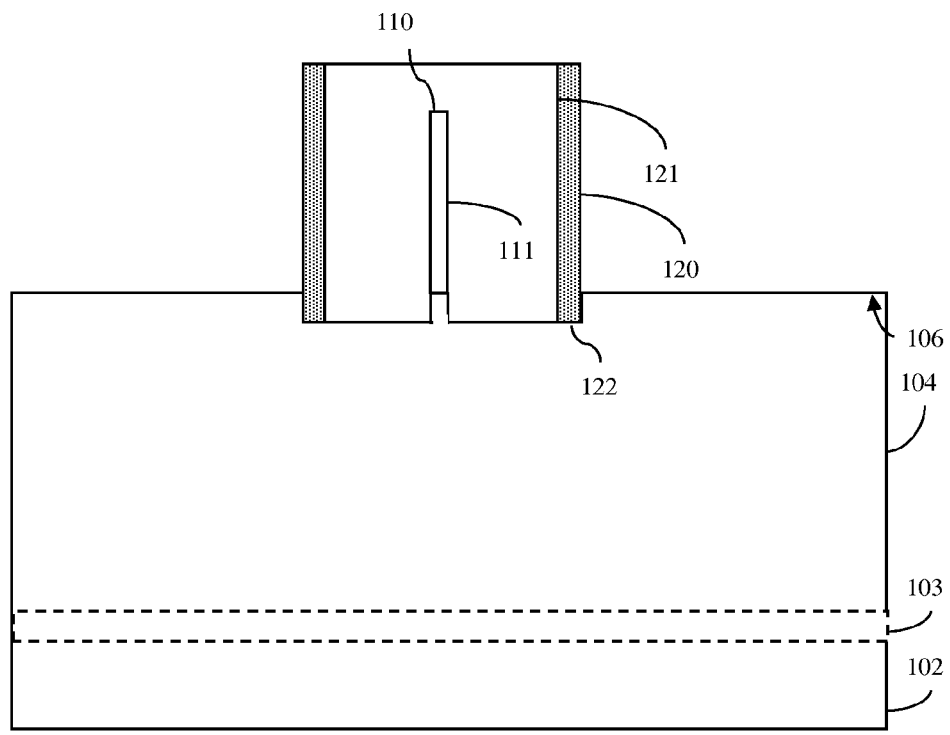
FIGS. 6A-B are cross-section and top view diagrams, respectively, of a partially completed GAAFET formed according to the method of FIG. 3.
Figure 6B:
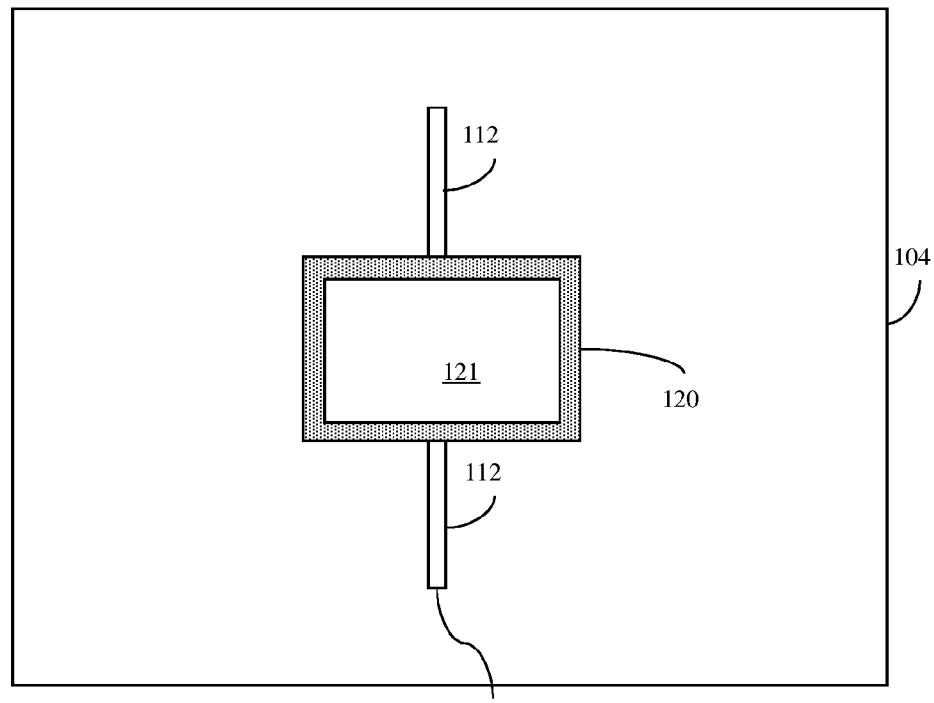

Next, a dummy gate 121 can be formed on the semiconductor body 110 and a gate sidewall spacer 120 can be formed on the dummy gate 121 (304, see FIGS. 6A-6B). To form the dummy gate 121, a blanket dummy gate material layer (e.g., a silicon layer, a polysilicon layer, or an amorphous silicon layer) can be deposited over the semiconductor body 110. This dummy gate material layer can be lithographically patterned and etched such that the resulting dummy gate 121 is adjacent to the top and opposing sides of the semiconductor body 110 at the channel region 111 and such that the source/drain regions 112 are exposed. Following formation of the dummy gate 121, a gate sidewall spacer 120 can be formed immediately adjacent to the vertical sidewalls of the dummy gate 121 so that the gate sidewall spacer 120 laterally surrounds the dummy gate 121. The gate sidewall spacer 120 can comprise, for example, one or more layers of dielectric material comprising any of silicon dioxide, silicon nitride, silicon oxynitride, air-gaps, etc. and can be formed using conventional sidewall spacer formation techniques. For example, one or more layers of dielectric material can be deposited over the dummy gate 121 and an anisotropic etch process can be performed in order to remove the layer(s) of dielectric material from horizontal surfaces such that the resulting gate sidewall spacer 120 remains on the vertical sidewalls of the dummy gate 121. It should be noted that the dielectric material used for the gate sidewall spacer 120 should be different from the insulator material of the insulator layer 104 so that the insulator layer 104 can be selectively etched over the gate sidewall spacer 120 and semiconductor body 110 at process 312, discussed in detail below. It should also be noted that, if portions of the insulator layer 104 adjacent to opposing sides of the semiconductor body 110 at the channel region 111 were previously recessed, as described above and illustrated in FIG. 5, the lower edge 122 of this gate sidewall spacer 120 will extend vertically into the insulator layer 104 (as illustrated in FIG. 6A), as opposed to being on and immediately adjacent to the top surface 106 of the insulator layer 104.

Figure 7:
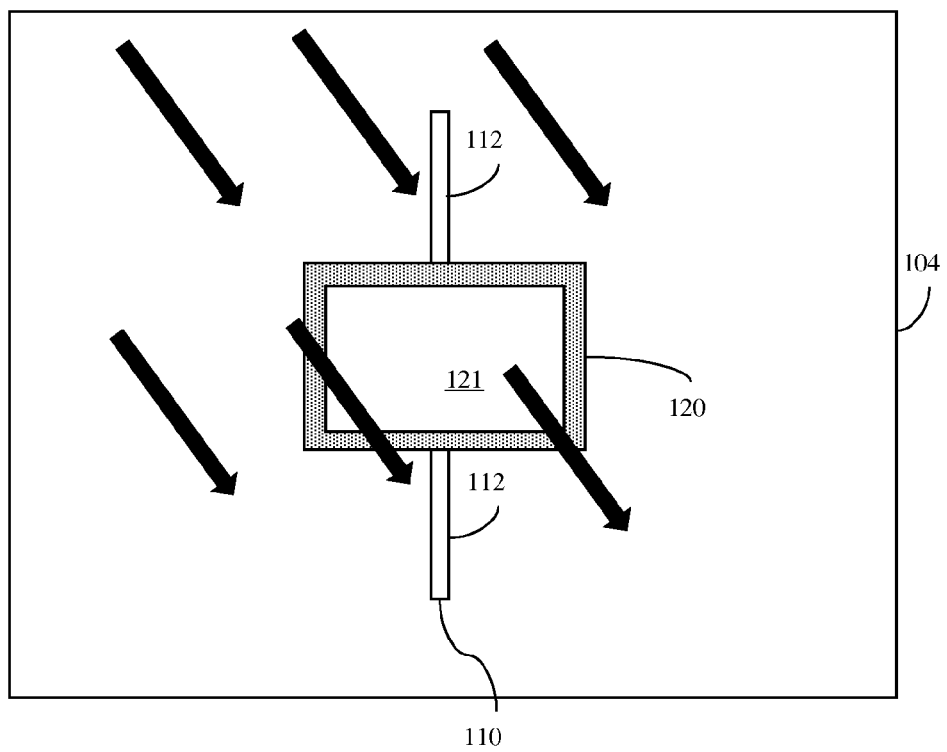
FIG. 7 is a top view diagram of a partially completed GAAFET formed according to the method of FIG. 3.

After the dummy gate 121 and gate sidewall spacer 120 are formed, a dopant implantation process can be performed in order to dope the source/drain regions 112 of the semiconductor body 110 such that the source/drain regions 112 have a desired conductivity type and level relative to the conductivity type and level of the channel region 111 (306, see FIG. 7). For example, this dopant implantation process can be performed so that, in the resulting GAAFET 100 structure, the source/drain regions 112 have a first type conductivity at a relatively high conductivity level and the channel region 111 has a second type conductivity that is different from the first type conductivity. As discussed in greater detail above with regard to the structure, the first type conductivity and the second type conductivity will vary depending upon whether the GAAFET 100 is an N-type GAAFET or a P-type GAAFET. It should be noted that additional dopant implantation processes can be performed before and/or after the formation of the dummy gate 121 and gate sidewall spacer 120 in order to dope additional regions in the semiconductor body 110 (e.g., source/drain extension region(s), halo region (s), etc.). As discussed in greater detail above with regard to the structure, different dopants can be used to achieve the different type conductivities (i.e., P-type conductivity and N-type conductivity) in the different regions of the semiconductor body 110 and that those dopants will vary depending upon the different semiconductor materials used.

Figure 8:
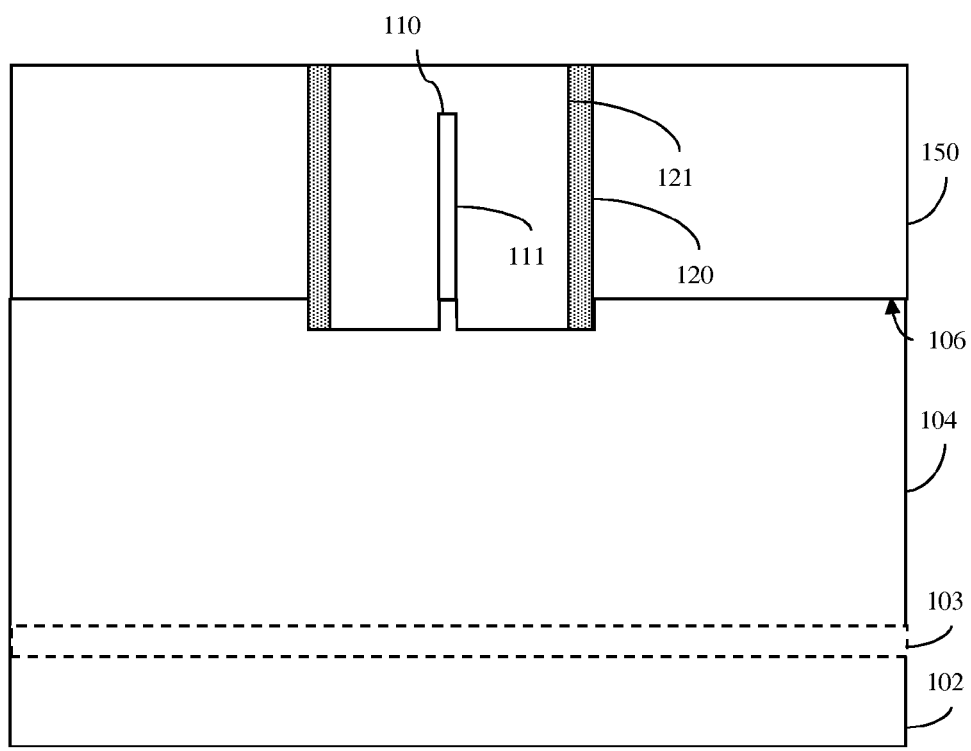
FIG. 8 is a cross-section diagram of a partially completed GAAFET formed according to the method of FIG. 3.
Figure 9:
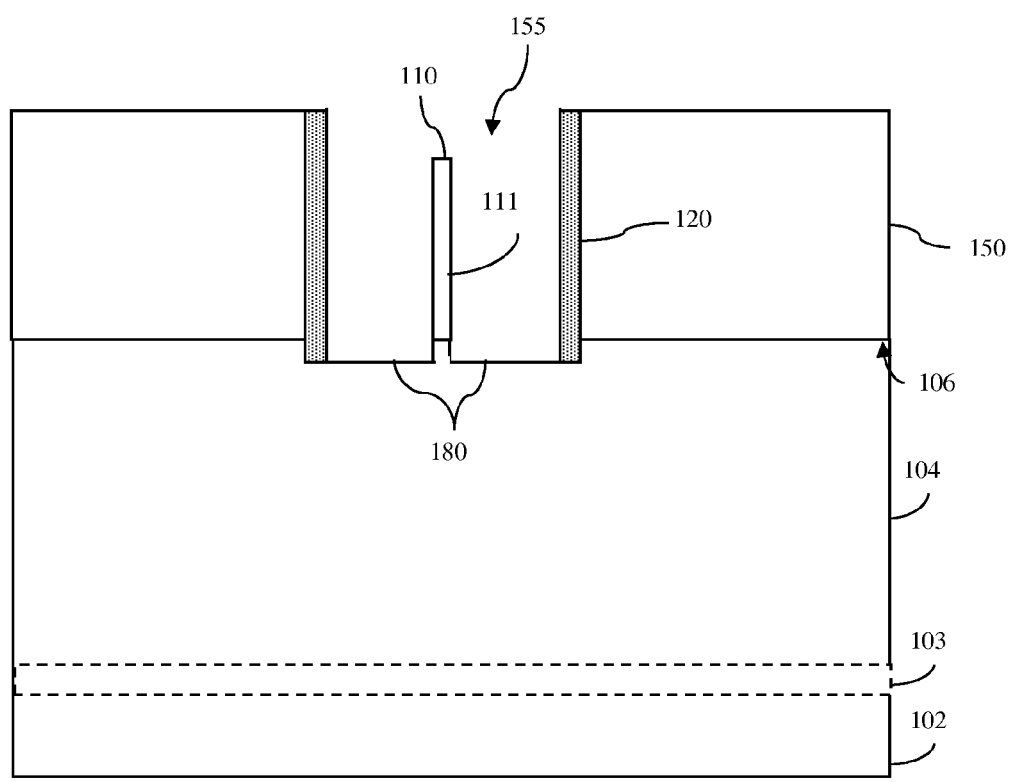
FIG. 9 is a cross-section diagram of a partially completed GAAFET formed according to the method of FIG. 3.

Subsequently, a dielectric layer 150 can be formed (e.g., deposited) over the insulator layer 104, over the exposed source/drain regions 112 of the semiconductor body 110, over the gate sidewall spacer 120 and over the dummy gate 121 (308, see FIG. 8). This dielectric layer 150 can comprise one or more layers of conventional interlayer dielectric material (e.g., silicon dioxide, silicon nitride, silicon oxynitride, borophosphosilicate glass (BPSG), phosphosilicate glass (BPSG), boron silicate glass (BSG), or undoped silicate glass (USG)). After formation, this dielectric layer 150 can be planarized (e.g., using a conventional chemical mechanical polishing (CMP) process) so as to expose the top surface of the dummy gate 121. Once the dummy gate 121 is exposed, it can be selectively removed using, for example, an etch process that is selective for the dummy gate material over the materials used for the dielectric layer 150 and gate sidewall spacer 120 (310, see FIG. 9). Removal of the dummy gate 121 creates, in the dielectric layer 150, an opening 155 that exposes the top and opposing sides of the semiconductor body 110 at the channel region 111 and that further exposes the portions 180 of the insulator layer 104 adjacent to the opposing sides of the semiconductor body 110 at the channel region 111.

Figure 10A:
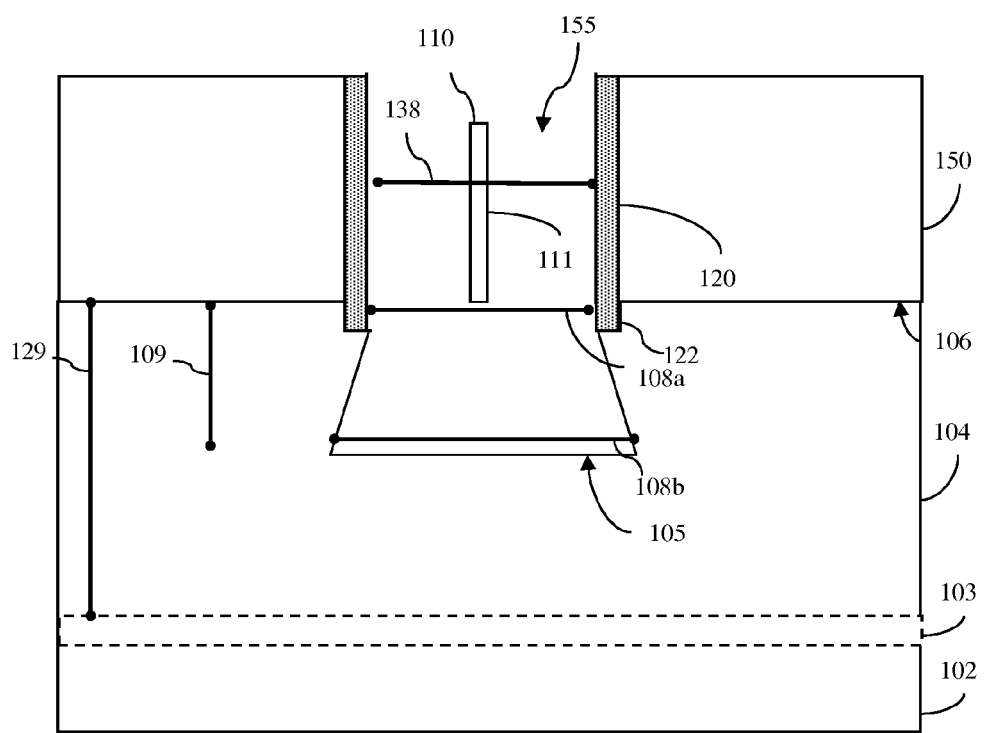
FIGS. 10A-B are different cross-section diagrams of a partially completed GAAFET formed according to the method of FIG. 3.
Figure 10B:
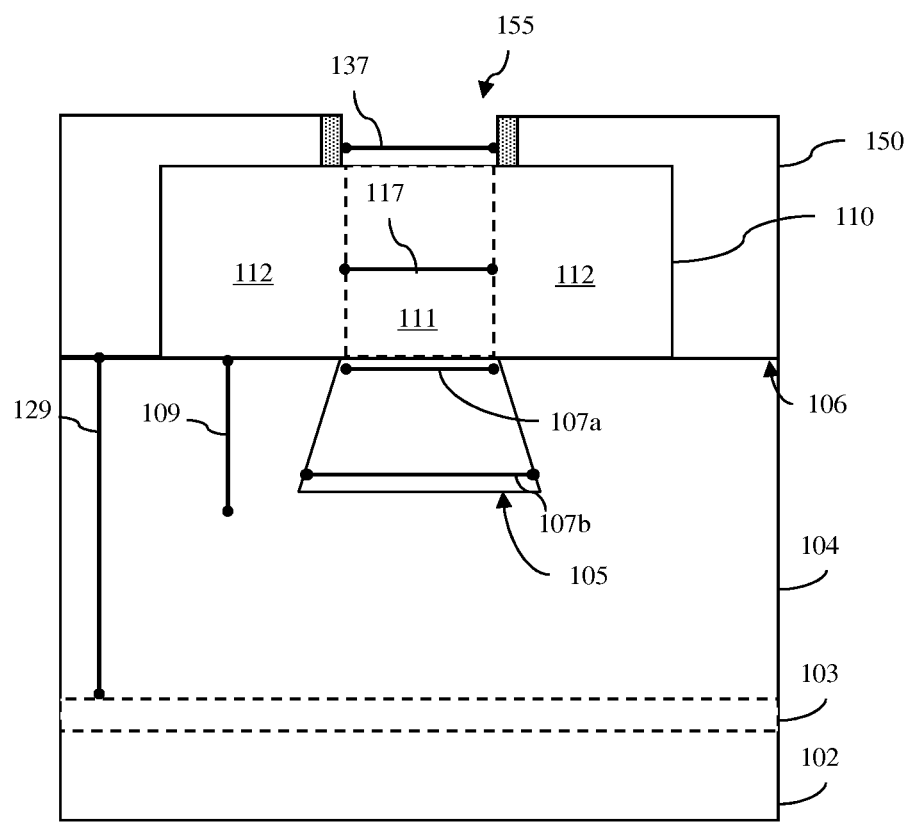

Next, the exposed portions 180 of the insulator layer 104 within the opening 155 can be etched using an isotropic etch process (312, see FIGS. 10A-10B). This isotropic etch process should be selective for the insulator material of the insulator layer 104 over the dielectric material used for the gate sidewall spacer 120 and over the semiconductor material used for the semiconductor body 110. Additionally, this isotropic etch process should continue until trenches formed on either side of the semiconductor body 110 merge below the semiconductor body 110, thereby forming a cavity 105 that is aligned below the bottom of the semiconductor body 110 at the channel region 111.

Once the cavity 105 is formed, a gate 130 (e.g., a replacement metal gate) can be formed such that a lower portion 131 of the gate 130 fills the cavity 105 in the insulator layer 104 and an upper portion 132 of the gate 130 fills the opening 155 in the dielectric layer 150, thereby ensuring that the gate 130 wraps entirely around the semiconductor body 110 at the channel region 111 (314, see FIGS. 1A-1C). Specifically, the lower portion 131 of the gate 130 will be aligned below and adjacent to the bottom of the semiconductor body 110 at the channel region 111 and the upper portion 132 of the gate 130 will be above the lower portion 131 and, particularly, adjacent to the top and the opposing sides of the semiconductor body 110 at the channel region 111 such that the gate 130 wraps entirely around the semiconductor body 110 at the channel region.

To form such a gate 130 at process 314, a gate dielectric 133 (e.g., a high-K gate dielectric layer) can be conformally deposited into the cavity 105 and opening 155 such that it is immediately adjacent to the top, bottom and opposing sides of the semiconductor body 110 and further such that it lines the cavity 105 and covers the gate sidewall spacer 120 in the opening 155. The high-K gate dielectric layer can comprise, for example, a hafnium (Hf)-based dielectric layer (e.g., hafnium oxide, hafnium silicon oxide, hafnium silicon oxynitride, hafnium aluminum oxide, etc.) or some other suitable high-K dielectric layer (e.g., aluminum oxide, tantalum oxide, zirconium oxide, etc.). Next, a gate conductor 136, which comprises one or more gate conductor layers, can be formed on the gate dielectric 133. For example, a first metal layer 134 can be conformally deposited so as to cover the conformal high-K gate dielectric layer. This first metal layer 134 can comprise a metal selected so as to have a specific work function appropriate for a given type FET (e.g., an N-type FET or a P-type FET). For example, for a silicon-based N-type FET, the first metal layer 134 can comprise, for example, hafnium, zirconium, titanium, tantalum, aluminum, or alloys thereof, such as hafnium carbide, zirconium carbide, titanium carbide, tantalum carbide, or aluminum carbide, so as to have a work function similar to that of N-doped polysilicon. For a silicon-based P-type FET, the first metal layer 134 can comprise, for example, ruthenium, palladium, platinum, cobalt, or nickel, or a metal oxide (e.g., aluminum carbon oxide or aluminum titanium carbon oxide) or a metal nitride (e.g., titanium nitride, titanium silicon nitride, tantalum silicon nitride, titanium aluminum nitride, or tantalum aluminum nitride) so as to have a work function similar to that of P-doped polysilicon. Next, a second metal layer 135 (e.g., a tungsten layer) can be deposited on the first metal layer 134 so as to fill the remaining portions of the cavity 105 and opening 155. Alternatively, any other suitable configuration of metal and/or metal alloys could be used for the gate conductor 136.

Following formation of the gate 130, one or more additional process steps can be performed in order to complete the GAAFET 100 structure (316, see FIGS. 1A-1C). For example, a chemical mechanical polishing (CMP) process can be performed in order to remove gate 130 materials from above the top surface of the dielectric layer 150 and one or more additional dielectric layers 160 can be deposited onto the dielectric layer 150 and over the upper portion 132 of the gate 130. The additional dielectric layer(s) 160 can comprise one or more layers of conventional interlayer dielectric material. For example, the additional dielectric layer(s) 160 can comprise the same interlayer dielectric material as that used for the dielectric layer 150. Alternatively, the additional dielectric layer(s) 160 can comprise a different interlayer dielectric material than that used for the dielectric layer 150. Subsequently, contacts 165 can be formed that extend vertically through the additional dielectric layer(s) 160 and dielectric layer 150 to various components of the GAAFET 100 including, but not limited to, the source/drain regions 112 (as shown in FIG. 1A) and upper portion 132 of the gate 130.

Figure 11:
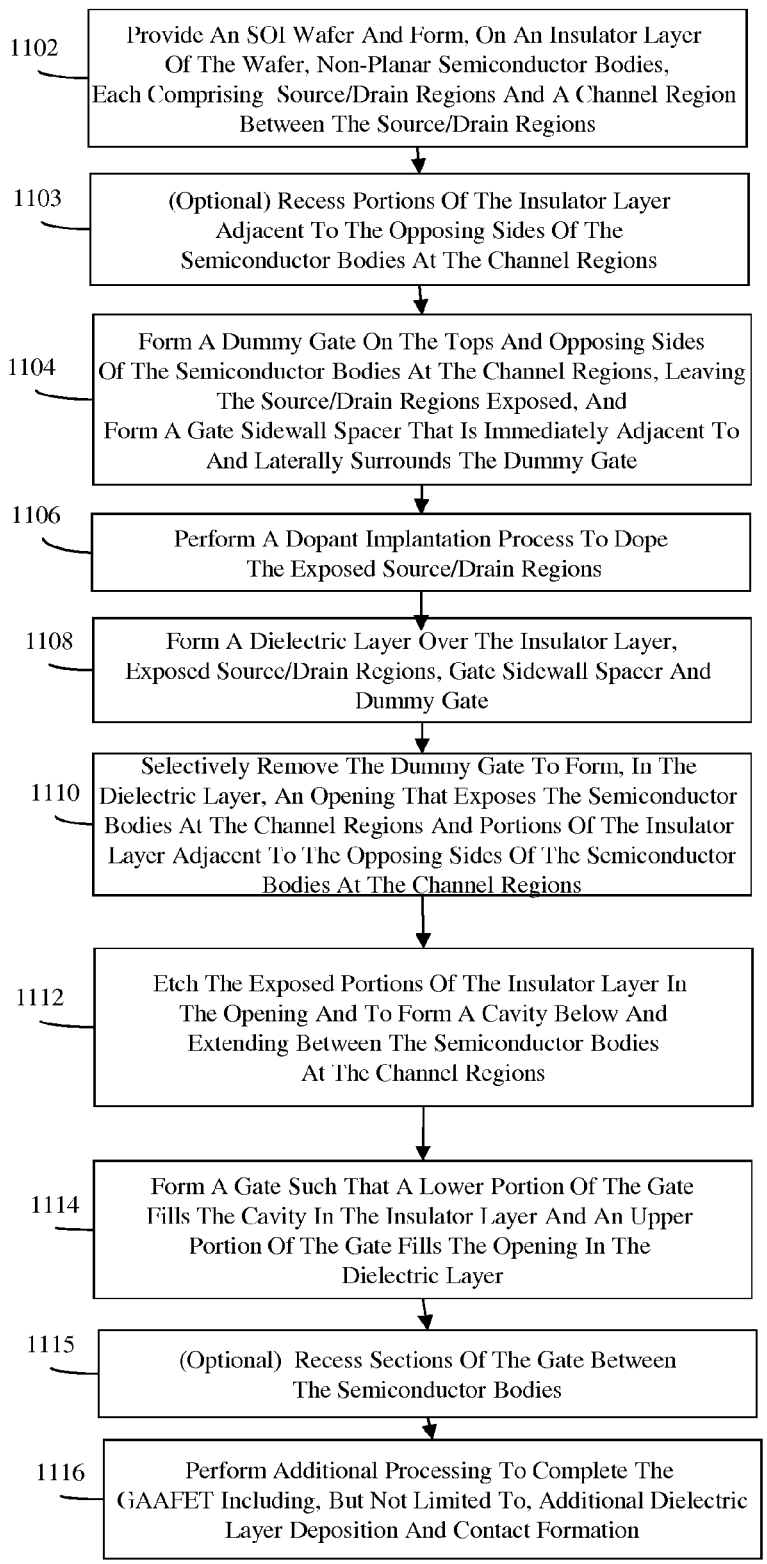
FIG. 11 is a flow diagram illustrating a method of forming the GAAFET of FIGS. 1A-1C.
Figure 12A:
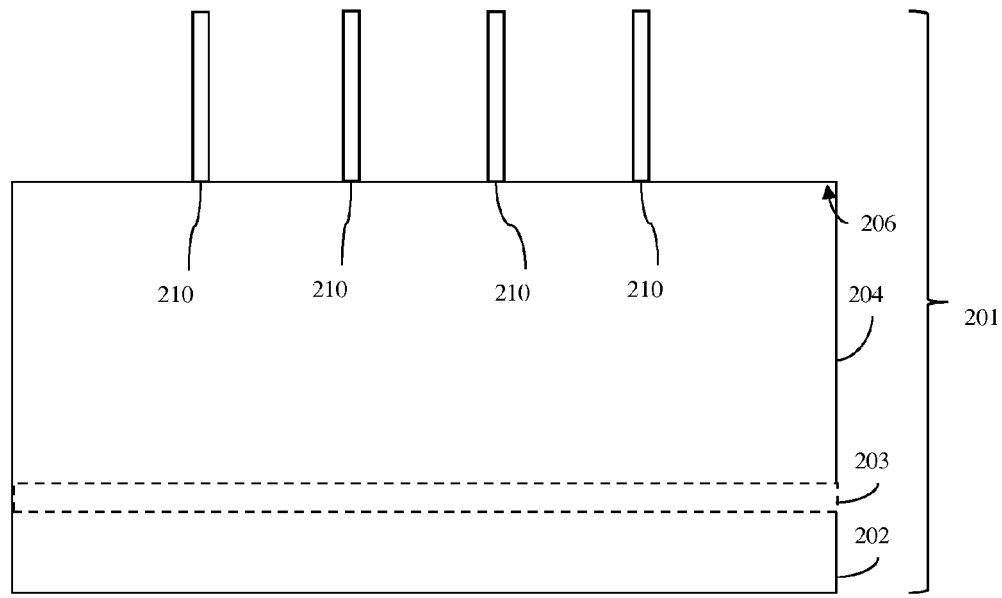
FIGS. 12A-B are cross-section and top view diagrams, respectively, of a partially completed GAAFET formed according to the method of FIG. 3.
Figure 12B:
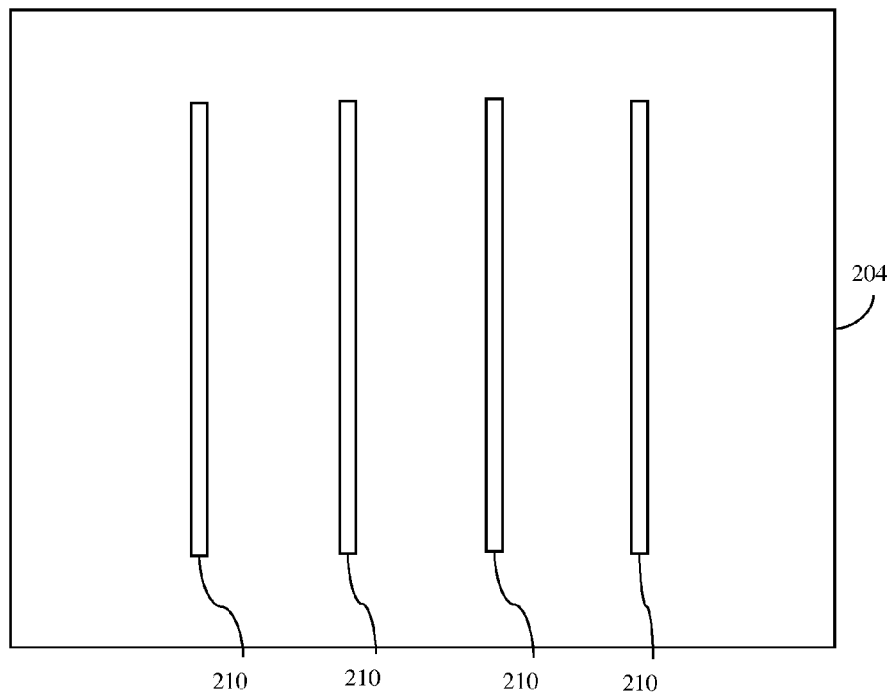

Referring to the flow diagram of FIG. 11, also disclosed herein is a method of forming the GAAFET 200 of FIGS. 2A-2C. This method can comprise providing a semiconductor-on-insulator (SOI) wafer 201 and further forming multiple, essentially parallel, non-planar semiconductor bodies 210 from a semiconductor layer of the SOI wafer (1102, see FIGS. 12A-12B). Specifically, the SOI wafer 201 can comprise a semiconductor substrate 202 (e.g., a silicon substrate or any other suitable semiconductor substrate, such as a germanium substrate, a gallium arsenide substrate, a gallium nitride substrate, etc.). The SOI wafer 201 can further comprise an insulator layer 204 (e.g., a silicon dioxide layer, a silicon nitride layer, a silicon oxynitride layer or any other suitable insulator layer) on the substrate 202 and a semiconductor layer on the insulator layer 204. Optionally, the SOI wafer 201 can further comprise an additional insulator layer 203 between the substrate 202 and the insulator layer 204. This additional insulator layer 203 can comprise a different insulator material than the insulator layer 204 and, particularly, can comprise an insulator material having a lower thermal resistance than the insulator material of the insulator layer 204. Thus, for example, the additional insulator layer 203 can comprise aluminum oxide or any other suitable relatively low thermal resistance insulator material. Using any one of various conventional techniques (e.g., a lithographic patterning and etch technique or a sidewall image transfer (SIT) technique), multiple, essentially parallel, non-planar semiconductor bodies 210 can be etched into the semiconductor layer. The resulting semiconductor bodies 210 will be the top surface 206 of the insulator layer 204 and can each comprise source/drain regions 212 and a channel region 211 positioned laterally between the source/drain regions 212.

Figure 13:
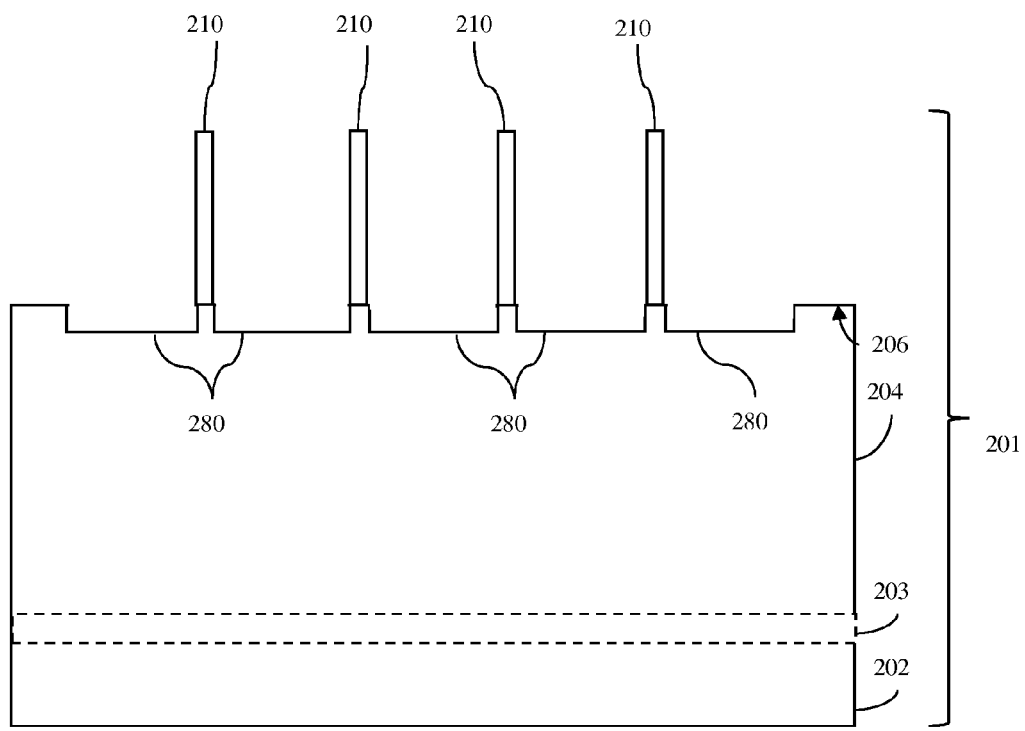
FIG. 13 is a cross-section diagram of a partially completed GAAFET formed according to the method of FIG. 11.

Optionally, after the semiconductor bodies 210 are formed, a mask layer can be formed over the semiconductor bodies 210. This mask layer can be patterned so as to have an opening that exposes the semiconductor bodies 210 at their channel regions 211 and that further exposes portions 280 of the insulator layer 204 adjacent to the opposing sides of the semiconductor bodies 210 at the channel regions 211. Next, an anisotropic etch process can be performed that is selective for the insulator material of the insulator layer 204 over the semiconductor material of the semiconductor bodies 210 in order to recess the exposed portions 280 of the insulator layer 204 (1103, see FIG. 13). Then, the mask layer can be removed.

Figure 14A:
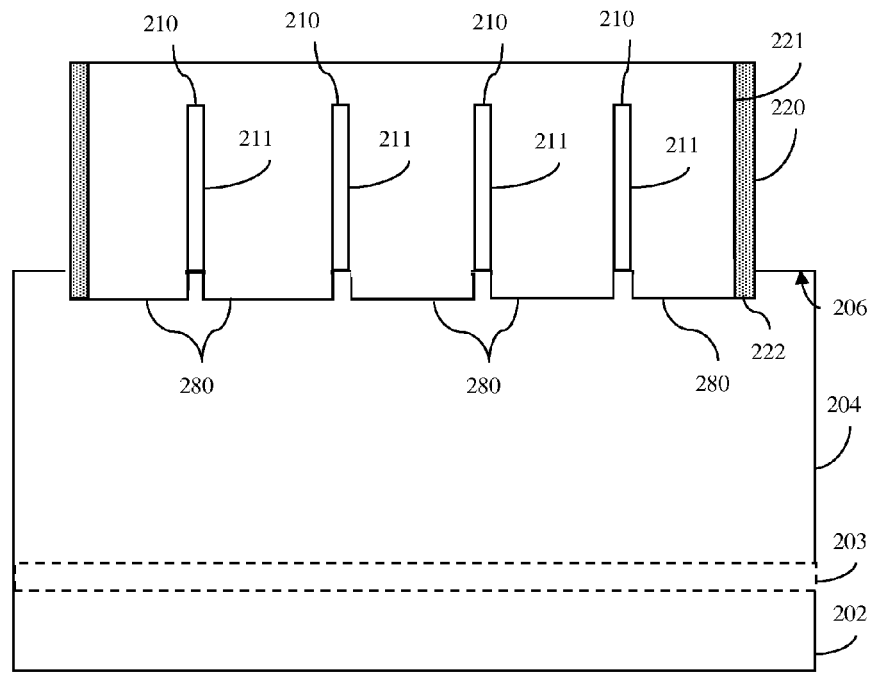
FIGS. 14A-B are cross-section and top view diagrams, respectively, of a partially completed GAAFET formed according to the method of FIG. 11.
Figure 14B:
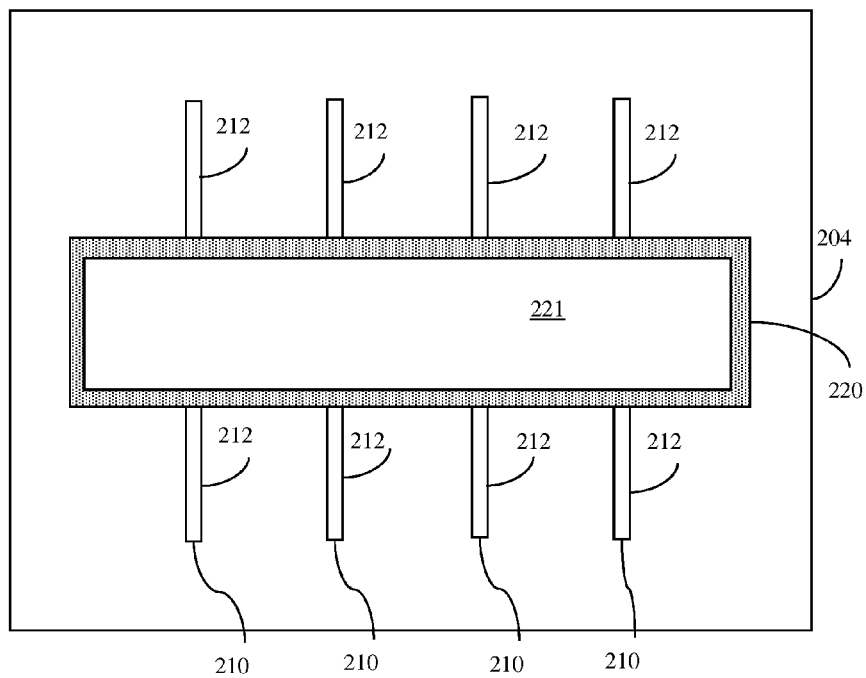

Next, a dummy gate 221 can be formed across the semiconductor bodies 210 and a gate sidewall spacer 220 can be formed on the dummy gate 221 (1104, see 14A-14B). To form the dummy gate 221, a blanket dummy gate material layer (e.g., a silicon layer, a polysilicon layer, or an amorphous silicon layer) can be deposited over the semiconductor bodies 210. This dummy gate material layer can be lithographically patterned and etched such that the resulting dummy gate 221 traverses the semiconductor bodies 210 at their channel regions 211 (i.e., such that the channel regions 211 remain covered by the dummy gate material) and such that the source/drain regions 212 are exposed. Following formation of the dummy gate 221, a gate sidewall spacer 220 can be formed immediately adjacent to the vertical sidewalls of the dummy gate 221 so that the gate sidewall spacer 220 laterally surrounds the dummy gate 221. The gate sidewall spacer 220 can comprise, for example, one or more layers of dielectric material comprising any of silicon dioxide, silicon nitride, silicon oxynitride, air-gaps, etc. and can be formed using conventional sidewall spacer formation techniques. For example, one or more layers of dielectric material can be deposited over the dummy gate 221 and an anisotropic etch process can be performed in order to remove the layer(s) of dielectric material from horizontal surfaces such that the resulting gate sidewall spacer 220 remains on the vertical sidewalls of the dummy gate 221. It should be noted that the dielectric material used for the gate sidewall spacer 220 should be different from the insulator material of the insulator layer 204 so that the insulator layer 204 can be selectively etched over the gate sidewall spacer 220 and semiconductor bodies 210 at process 1112, discussed in detail below. It should also be noted that, if portions of the insulator layer 104 adjacent to opposing sides of the semiconductor bodies 210 at the channel regions 211 were previously recessed, as described above and illustrated in FIG. 13, the lower edge 222 of this gate sidewall spacer 220 will extend vertically into the insulator layer 204 (as illustrated in FIG. 14A), as opposed to being on and immediately adjacent to the top surface 206 of the insulator layer 204.

Figure 15:
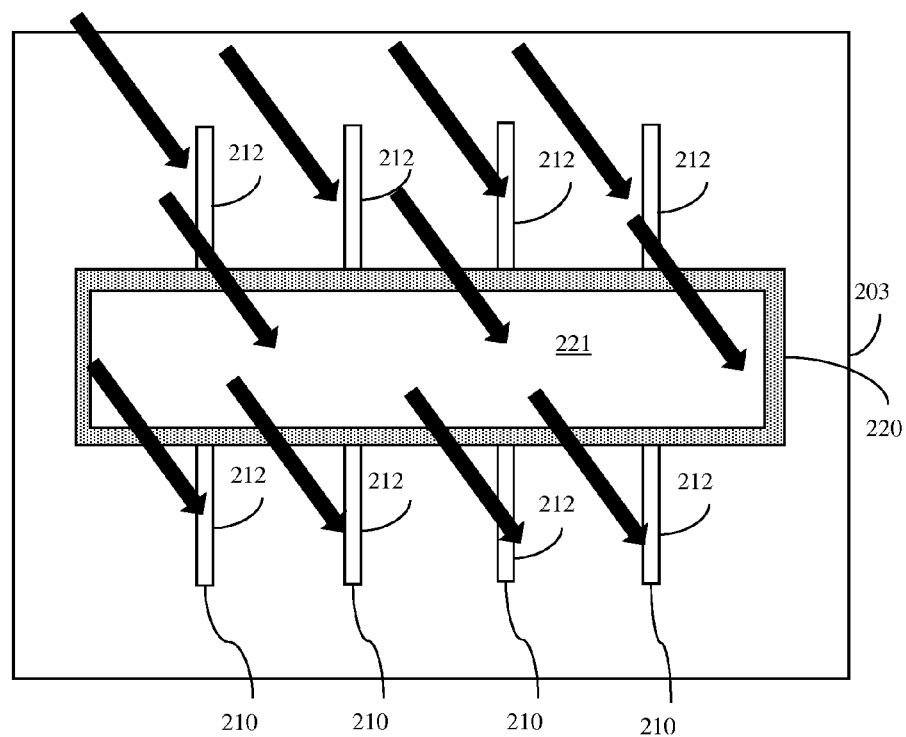
FIG. 15 is a top view diagram of a partially completed GAAFET formed according to the method of FIG. 11.

After the dummy gate 221 and gate sidewall spacer 220 are formed, a dopant implantation process can be performed to dope the source/drain regions 212 of the semiconductor bodies 210 such that the source/drain regions 212 have a desired conductivity type and level relative to the conductivity type and level of the channel regions 211 (1106, see FIG. 15). For example, this dopant implantation process can be performed so that, in the resulting GAAFET 200 structure, the source/drain regions 212 have a first type conductivity at a relatively high conductivity level and the channel regions 211 have a second type conductivity that is different from the first type conductivity. As discussed in greater detail above with regard to the structure, the first type conductivity and the second type conductivity will vary depending upon whether the GAAFET 200 is an N-type GAAFET or a P-type GAAFET. It should be noted that additional dopant implantation processes can be performed before and/or after the formation of the dummy gate 221 and gate sidewall spacer 220 in order to dope additional regions in the semiconductor bodies 210 (e.g., source/drain extension region(s), halo region(s), etc.). As discussed in greater detail above with regard to the structure, different dopants can be used to achieve the different type conductivities (i.e., P-type conductivity and N-type conductivity) in the different regions of the semiconductor bodies 210 and that those dopants will vary depending upon the different semiconductor materials used.

Figure 16:
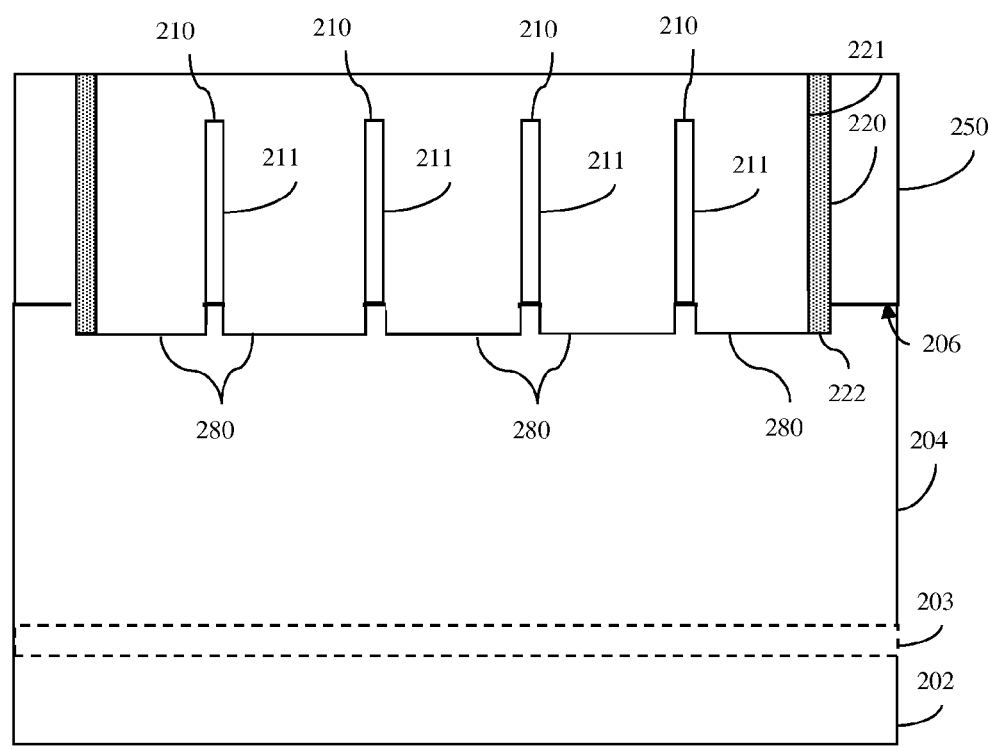
FIG. 16 is a cross-section diagram of a partially completed GAAFET formed according to the method of FIG. 11.
Figure 17:
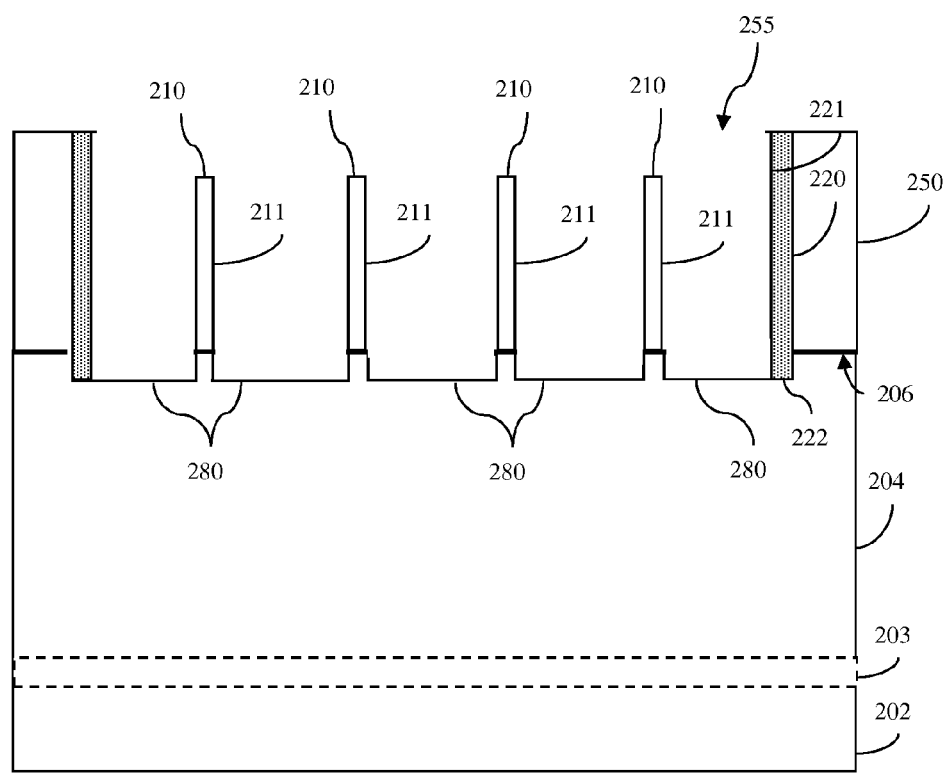
FIG. 17 is a cross-section diagram of a partially completed GAAFET formed according to the method of FIG. 11.

Subsequently, a dielectric layer 250 can be formed (e.g., deposited) over the insulator layer 204, over the exposed source/drain regions 212 of the semiconductor bodies 210, over the gate sidewall spacer 220 and over the dummy gate 221 (1108, see FIG. 16). This dielectric layer 250 can comprise one or more layers of conventional interlayer dielectric material (e.g., silicon dioxide, silicon nitride, silicon oxynitride, borophosphosilicate glass (BPSG), phosphosilicate glass (BPSG), boron silicate glass (BSG), or undoped silicate glass (USG)). After formation, this dielectric layer 250 can be planarized (e.g., using a conventional chemical mechanical polishing (CMP) process) so as to expose the top surface of the dummy gate 221. Once the dummy gate 221 is exposed, it can be selectively removed using, for example, an etch process that is selective for the dummy gate material over the materials used for the dielectric layer 250 and gate sidewall spacer 220 (1110, see FIG. 17). Removal of the dummy gate 221 creates, in the dielectric layer 150, an opening 255 that exposes the tops and opposing sides of the semiconductor bodies 210 at the channel regions 211 and further exposes the portions 280 of the insulator layer 204 adjacent to and extending laterally between the opposing sides of the semiconductor bodies 210 at the channel regions 211.

Figure 18A:
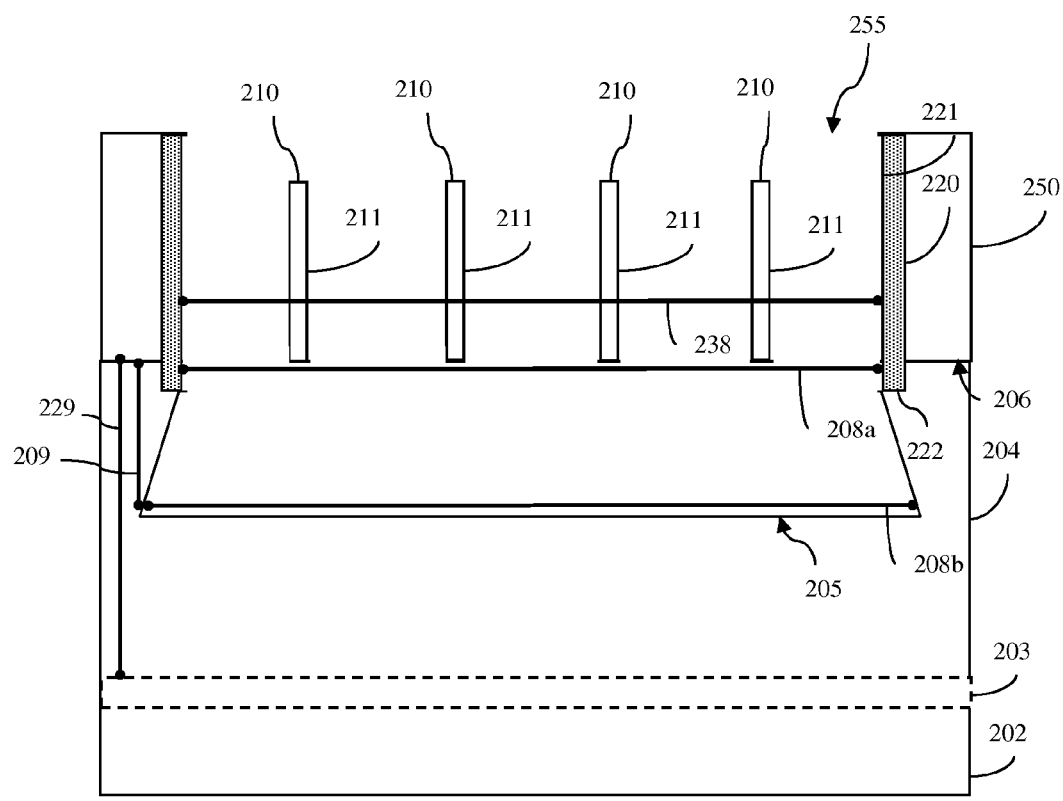
FIGS. 18A-B are different cross-section diagrams of a partially completed GAAFET formed according to the method of FIG. 11.
Figure 18B:
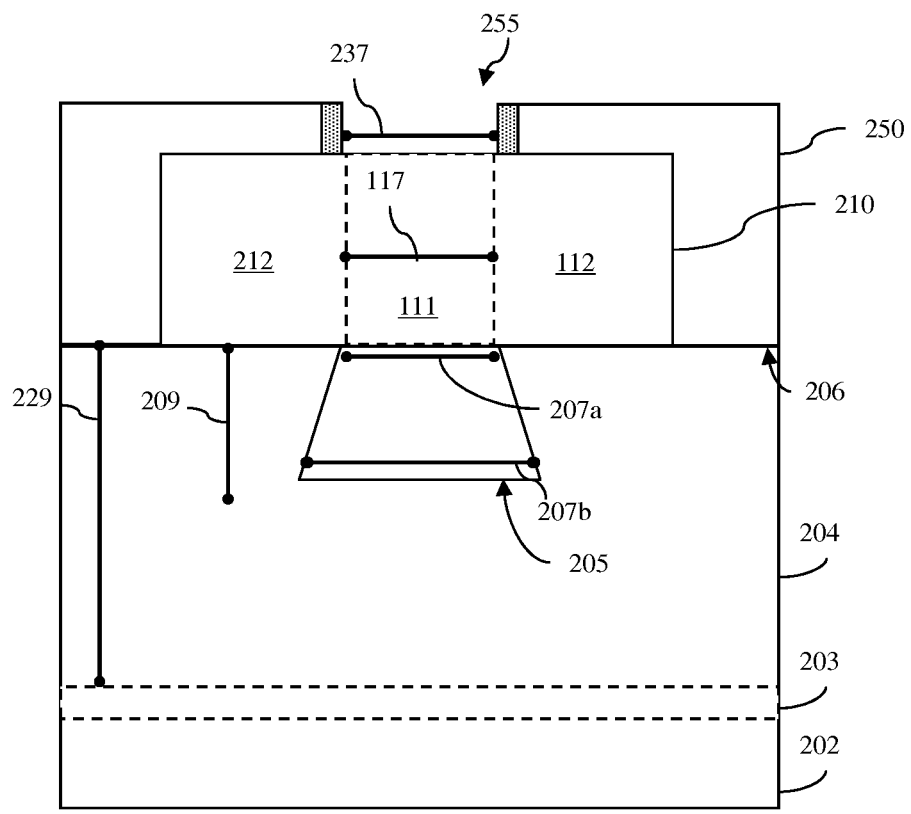

Next, the exposed portions 280 of the insulator layer 204 within the opening 255 can be etched using an isotropic etch process (1112, see FIGS. 18A-18B). This isotropic etch process should be selective for the insulator material of the insulator layer 204 over the dielectric material used for the gate sidewall spacer 220 and the semiconductor material used for the semiconductor bodies 210. Additionally, this isotropic etch process should continue until trenches formed on either side of the semiconductor bodies 210 merge below the semiconductor bodies 210, thereby forming a cavity 205 that is aligned below the bottoms of the semiconductor bodies 210 at their channel regions 211 and that extends laterally between the semiconductor bodies 210 at their channel regions 211.

Figure 19:
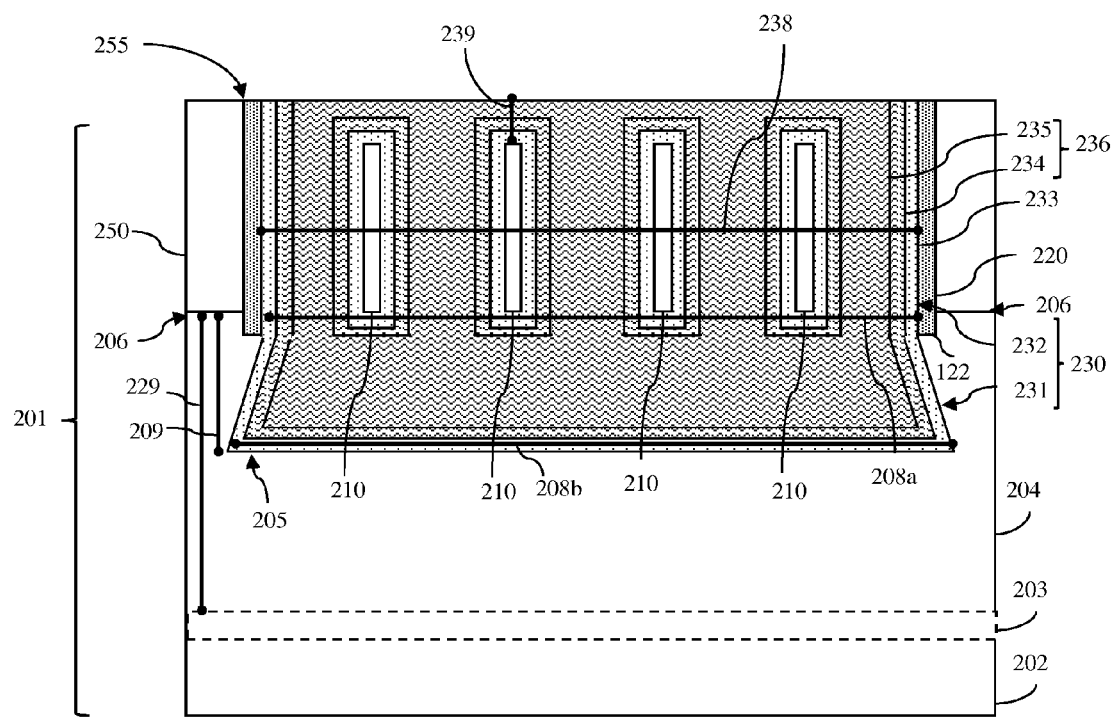
FIG. 19 is a cross-section diagram of a partially completed GAAFET formed according to the method of FIG. 11.

Once the cavity 205 is formed, a gate 230 (e.g., a replacement metal gate) can be formed such that a lower portion 231 of the gate 230 fills the cavity 205 in the insulator layer 204 and an upper portion 232 of the gate 230 fills the opening 255 in the dielectric layer 250, thereby ensuring that the gate 230 wraps entirely around each of the semiconductor bodies 210 at their channel regions 211 (1114, see FIGS. 19A-19B). Specifically, the lower portion 231 of the gate 230 will be aligned below and adjacent to the bottoms of the semiconductor bodies 210 at the channel regions 211 and will extend between the semiconductor bodies 210 at the channel regions 211. Additionally, the upper portion 232 of the gate 230 will be above the lower portion 231 and, particularly, adjacent to the tops and the opposing sides of the semiconductor bodies 210 at the channel regions 211 and will also extend between the semiconductor bodies 210 at their channel regions 211.

To form such a gate 230 at process 1114, a gate dielectric 233 (e.g., a high-K gate dielectric layer) can be conformally deposited such that it is immediately adjacent to the tops, bottoms and opposing sides of each of the semiconductor bodies 210 at their channel regions 211 and further such that it lines the cavity 205 and covers the gate sidewall spacer 220 in the opening 255. The high-K gate dielectric layer can comprise, for example, a hafnium (Hf)-based dielectric layer (e.g., hafnium oxide, hafnium silicon oxide, hafnium silicon oxynitride, hafnium aluminum oxide, etc.) or some other suitable high-K dielectric layer (e.g., aluminum oxide, tantalum oxide, zirconium oxide, etc.). Next, a gate conductor 236, which comprises one or more gate conductor layers, can be formed on the gate dielectric 233. For example, a first metal layer 234 can be conformally deposited so as to cover the high-K gate dielectric layer. This first metal layer 234 can comprise a metal selected so as to have a specific work function appropriate for a given type FET (e.g., an N-type FET or a P-type FET). For example, for a silicon-based N-type FET, the first metal layer 234 can comprise, for example, hafnium, zirconium, titanium, tantalum, aluminum, or alloys thereof, such as hafnium carbide, zirconium carbide, titanium carbide, tantalum carbide, or aluminum carbide, so as to have a work function similar to that of N-doped polysilicon. For a silicon-based P-type FET, the first metal layer 234 can comprise, for example, ruthenium, palladium, platinum, cobalt, or nickel, or a metal oxide (e.g., aluminum carbon oxide or aluminum titanium carbon oxide) or a metal nitride (e.g., titanium nitride, titanium silicon nitride, tantalum silicon nitride, titanium aluminum nitride, or tantalum aluminum nitride) so as to have a work function similar to that of P-doped polysilicon. Next, a second metal layer 235 (e.g., a tungsten layer) can be deposited on the first metal layer 234 so as to fill the remaining portions of the cavity 205 and opening 255. Alternatively, any other suitable configuration of metal and/or metal alloys could be used for the gate conductor 236.

Figure 20A:
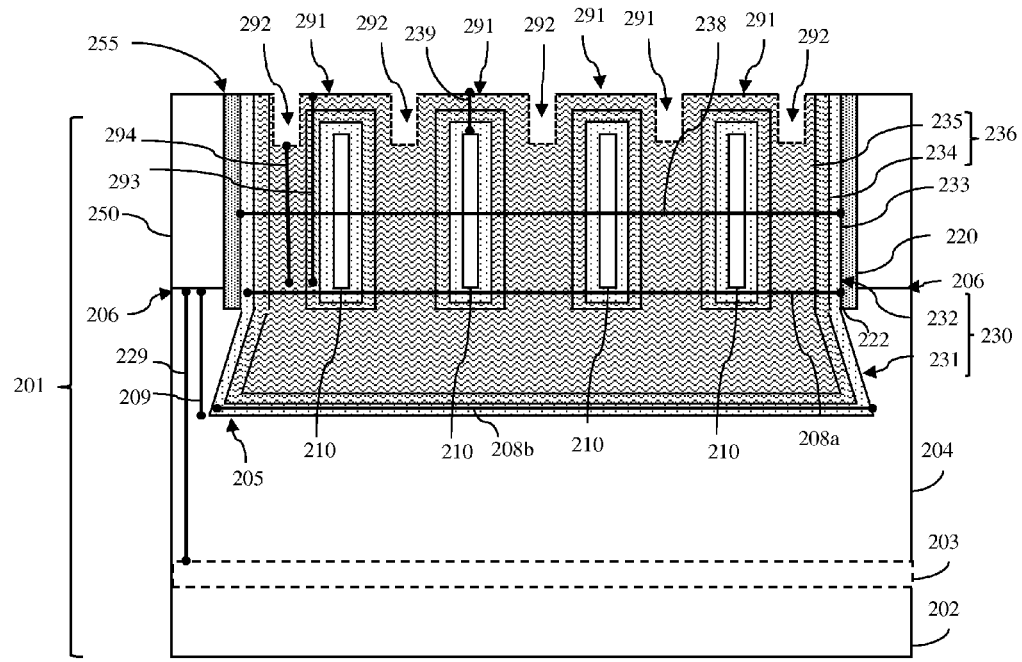
FIGS. 20A-B are cross-section and top view diagrams, respectively, of a partially completed GAAFET formed according to the method of FIG. 11.
Figure 20B:
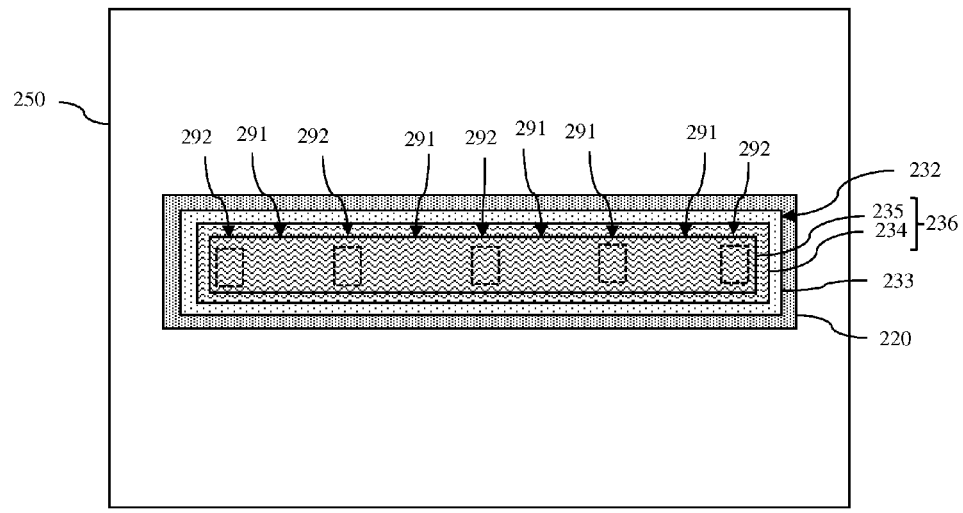

Optionally, following formation of the gate 230, sections 292 of the upper portion 232 of the gate 230 between the semiconductor bodies 210 can be recessed (1115, see FIGS. 20A and 20B). That is, the upper portion 232 of the gate 230 can have first sections 291 adjacent to the semiconductor bodies 210 and second sections 292 that extend between the semiconductor bodies 210. Recesses can be lithographically patterned and etched in the second sections 192 such that the first sections 291 have a first height 293 relative to the top surface 206 of the insulator layer 204 and the second sections 292 have a second height 294, which is less than the first height 293, relative to the top surface of the insulator layer 204. Recessing the second sections 292 can reduce gate-to-source/drain contact capacitance in the resulting GAAFET 200.

One or more additional process steps can be performed in order to complete the GAAFET 200 structure (1116, see FIGS. 2A-2C). For example, a chemical mechanical polishing (CMP) process can be performed in order to remove gate 230 materials from above the top surface of the dielectric layer 250 and one or more additional dielectric layers 260 can be deposited onto the dielectric layer 250 and over the upper portion 232 of the gate 230. The additional dielectric layer(s) 260 can comprise one or more layers of conventional interlayer dielectric material. For example, the additional dielectric layer(s) 260 can comprise the same interlayer dielectric material as that used for the dielectric layer 250. Alternatively, the additional dielectric layer(s) 260 can comprise a different interlayer dielectric material than that used for the dielectric layer 250. Subsequently, contacts 265 can be formed that extend vertically through the additional dielectric layer(s) 260 and dielectric layer 250 to various components of the GAAFET 200 including, but not limited to, the source/drain regions 212 (as shown) and upper portion 232 of the gate 230.

It should be noted that, in the above-described methods, the dimensions of the non-planar semiconductor body(ies) 110, 210 formed on the insulator layer 104, 204 at process 302 of FIG. 3 and 1102 of FIG. 11 can vary depending upon the desired field effects in the resulting GAAFETs 100, 200. For example, relatively thin non-planar semiconductor body(ies) 110, 210 can be formed, as shown, such that essentially only two-dimensional field effects will be exhibited at the channel region(s) 111, 211 in the resulting GAAFETs 100, 200 (i.e., such that any field effects at the top(s) or bottom(s) of the semiconductor body(ies) 110, 210 at the channel region(s) 111, 211 would be negligible). However, it should be understood that the Figures are not intended to be limiting and that, alternatively, relatively thick non-planar semiconductor body (ies) 110, 210 could be formed such that four-dimensional field effects are exhibited at the channel region(s) 111, 211 in the resulting GAAFETs 100, 200 (i.e., such that field effects are exhibited at the top(s), bottom(s) and opposing sides of the semiconductor body(ies) 110, 210 at the channel region(s) 110, 210).

Additionally, in the above-described methods, the processes 312-314 of FIG. 3 and 1112-1114 of FIG. 11, which include etching exposed portions 180, 280 of the insulator layer to form the cavity 105, 205 below the bottom(s) of the semiconductor body(ies) 110, 210 at the channel region(s) 111, 211 and forming a gate 130, 230 having a lower portion 131, 231 in the cavity 105, 205 and an upper portion 132, 232 in an opening 155, 255 in the dielectric layer 150, 250 above the cavity 105, 205, can be tailored to reduce gate-to-source/drain contact capacitance, gate-to-substrate capacitance and gate resistance in the resulting GAAFETs 100, 200. For example, to reduce gate-to-source/drain contact capacitance and to reduce gate resistance, the processes 312-314 and 1112-1114 can be performed so that, in the resulting GAAFET 100, 200, the cavity 105, 205 and, thereby the lower portion 131, 231 of the gate 130, 230 that fills that cavity 105, 205 extends a greater distance below the bottom(s) of the semiconductor body(ies) 110, 210 than the upper portion 132, 232 of the gate 130, 230 extends above the top(s) of the semiconductor body(ies) 110, 210. That is, the lower portion 131, 231 of the gate 130, 230 can extend a first distance 109, 209 below the bottom(s) of the semiconductor body(ies) 110, 210, the upper portion 132, 232 of the gate 130, 230 can extend a second distance 139, 239 above the top(s) of the semiconductor body(ies) 110, 210, and the first distance 109, 209 can be greater than the second distance 139, 239. For example, the first distance 109, 209 can be 1.25 to 5 times greater than the second distance 139, 239. To minimize gate-to-substrate capacitance and to ensure that the lower portion 131, 231 of the gate 130, 230 remains electrically isolated from the semiconductor substrate 102, 202 below, the processes 312-314 and 1112-1114 can be performed such that the cavity 105, 205 and, thereby the lower portion 131, 231 of the gate 130, 230 that fills the cavity 105, 205, does not extend entirely through the insulator layer 104, 204 (or, if present, through the additional insulator layer 103, 203). That is, the cavity 105, 205 can be formed so that the depth of the cavity 105, 205 and, thereby the first distance 109, 209 that the lower portion 131, 231 of the gate 130, 230 extends into the insulator layer 104, 204 is than the thickness 129, 229 (e.g., less than ¾ the thickness 129, 229; less than ½ the thickness 129, 229, etc.) of the insulator layer 104, 204. Finally, to further reduce gate resistance, the processes 312-314 and 1112-1114 can be performed such that the size (i.e., the length and width) of the cavity 105, 205 and, thereby the size (i.e., length and width) of the lower portion 131, 231 of the gate 130, 230 contained within that cavity 105, 205 increases from the top surface 106, 206 of the insulator layer 104, 204 downward. More specifically, the isotropic etch used during cavity 105, 205 formation can be performed such that, in the resulting GAAFET 100, 200, the sides of the cavity 105, 205 and, thereby the sides of the lower portion 131, 231 of the gate 13, 230 that fills the cavity, are angled (as shown in FIGS. 10A-10B, 18A-18B) or curved, as opposed to being essentially perpendicular relative to the top surface 106, 206 of the insulator layer 104, 204. As a result, the length 107a, 207a and width 108a, 208a of the cavity 105, 205 in the insulator layer 104, 204 and of the lower portion 131, 231 of the gate 130, 230 within that cavity 105, 205, as measured at the interface between the cavity 105, 205 and the semiconductor body(ies) 110, 210, will be approximately equal to the length 137, 237 and width 138, 238 of the opening 155, 255 in the dielectric layer 150, 250 (see FIGS. 1A-1B and 2A-2B). However, the maximum size (i.e., the maximum length 107b, 207b and maximum width 108b, 208b) of the cavity 105, 205 in the insulator layer 104, 204 and of the lower portion 131, 231 of the gate 130, 230 within the cavity 105, 205 at some depth below the top surface 106, 206 of the insulator layer 104, 204 will be greater (e.g., 1.1 to 2 times greater) than the length 137, 237 and width 138, 238 of the opening 155, 255 and of the upper portion 132, 232 of the gate 130, 230.

It should be noted that, optionally, process 303 of FIG. 3 and process 1103 of FIG. 11 can be performed so that the portions of the insulator layer 104, 204 adjacent to the opposing sides of the semiconductor body(ies) 110, 210 at the channel region(s) 111, 211 are recessed prior to dummy gate 121, 221 formation. As a result, the gate sidewall spacer 120, 220 formed on the dummy gate 121, 221 will have a lower edge 122, 222 that extends vertically into the insulator layer 104, 204 (as illustrated), as opposed to being on and immediately adjacent to the top surface 106, 206 of the insulator layer 104, 204. The depth to which the portions of the insulator layer are recessed and, thereby the depth at which the lower edge 122, 222 of the gate sidewall spacer 120, 220 extends into the insulator layer 104, 204 can be selectively adjusted and used to dictate the depth within the insulator layer 104, 204 at which the size (i.e., length and width) of the cavity 105, 205 and, thereby the lower portion 131, 231 of the gate 130, 230 begins to increase relative to the size of the opening 155, 255 that contains the upper portion 132, 232. That is, the cavity 105, 205 and, thereby the lower portion 131, 231 of the gate 130, 230 contained therein can be approximately equal in size (i.e., in length and width) to the opening 155, 255 and, thereby the upper portion 132, 232 of the gate 130, 230 at the top surface 106, 206 of the insulator layer 104, 204, but can increase in size (i.e., in length and width) below the lower edge of the gate sidewall spacer 120, 220.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 21:
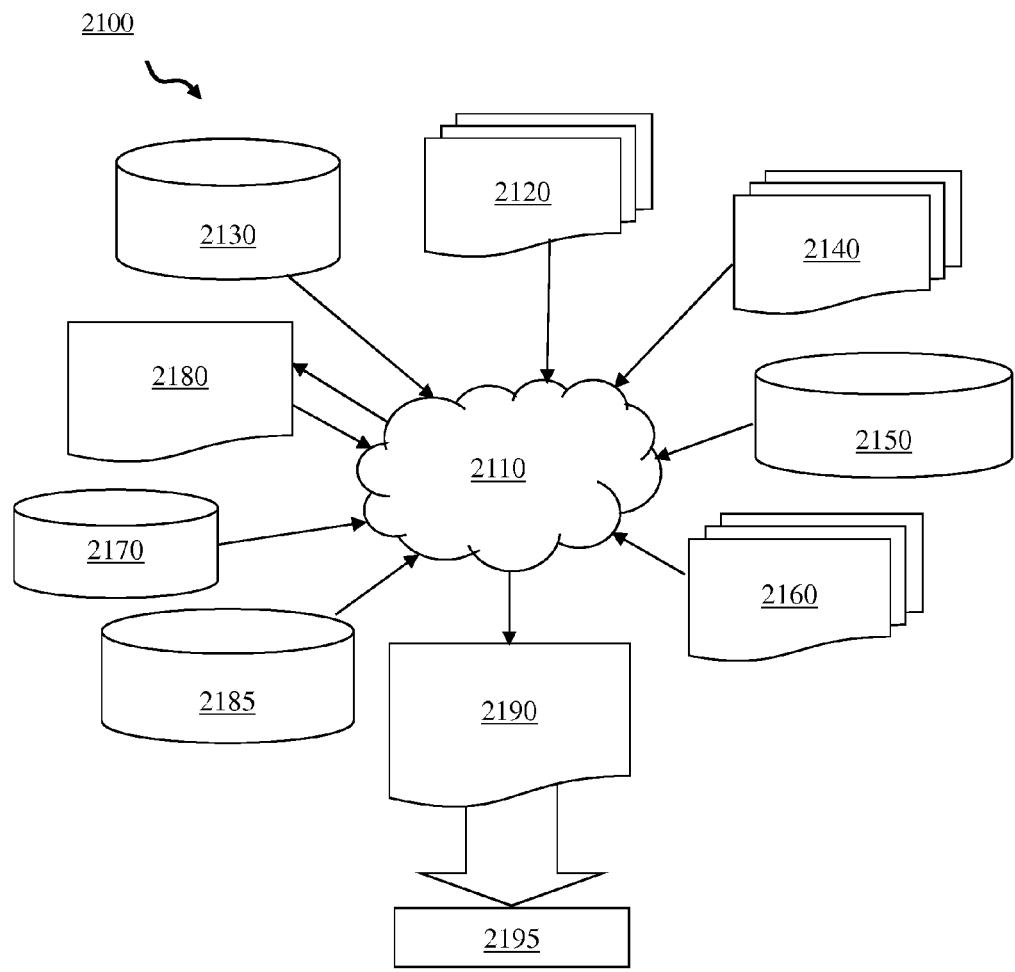
FIG. 21 is a block diagram illustrating an exemplary design flow used, for example, in the logic design, simulation, test, layout, and manufacture of the GAAFETs disclosed herein.

FIG. 21 shows a block diagram of an exemplary design flow 2100 used for example, in semiconductor IC logic design, simulation, test, layout, and manufacture. Design flow 2100 includes processes, machines and/or mechanisms for processing design structures or devices to generate logically or otherwise functionally equivalent representations of the design structures and/or devices described above and shown in FIGS. 1A-1C and 2A-2C. The design structures processed and/or generated by design flow 2100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 2100 may vary depending on the type of representation being designed. For example, a design flow 2100 for building an application specific IC (ASIC) may differ from a design flow 2100 for designing a standard component or from a design flow 2100 for instantiating the design into a programmable array, for example a programmable gate array (PGA) or a field programmable gate array (FPGA) offered by Altera® Inc. or Xilinx® Inc.

FIG. 21 illustrates multiple such design structures including an input design structure 2120 that is preferably processed by a design process 2110. Design structure 2120 may be a logical simulation design structure generated and processed by design process 2110 to produce a logically equivalent functional representation of a hardware device. Design structure 2120 may also or alternatively comprise data and/or program instructions that when processed by design process 2110, generate a functional representation of the physical structure of a hardware device. Whether representing functional and/or structural design features, design structure 2120 may be generated using electronic computer-aided design (ECAD) such as implemented by a core developer/designer. When encoded on a machine-readable data transmission, gate array, or storage medium, design structure 2120 may be accessed and processed by one or more hardware and/or software modules within design process 2110 to simulate or otherwise functionally represent an electronic component, circuit, electronic or logic module, apparatus, device, or system such as those shown in FIGS. 1A-1C and 2A-2C. As such, design structure 2120 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher-level design languages such as C or C++.

Design process 2110 preferably employs and incorporates hardware and/or software modules for synthesizing, translating, or otherwise processing a design/simulation functional equivalent of the components, circuits, devices, or logic structures shown in FIGS. 1A-1C and 2A-2C to generate a Netlist 2180 which may contain design structures such as design structure 2120. Netlist 2180 may comprise, for example, compiled or otherwise processed data structures representing a list of wires, discrete components, logic gates, control circuits, I/O devices, models, etc. that describes the connections to other elements and circuits in an integrated circuit design. Netlist 2180 may be synthesized using an iterative process in which netlist 2180 is resynthesized one or more times depending on design specifications and parameters for the device. As with other design structure types described herein, netlist 2180 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 2110 may include hardware and software modules for processing a variety of input data structure types including Netlist 2180. Such data structure types may reside, for example, within library elements 2130 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 2140, characterization data 2150, verification data 2160, design rules 2170, and test data files 2185 which may include input test patterns, output test results, and other testing information. Design process 2110 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 2110 without deviating from the scope and spirit of the invention. Design process 2110 may also include modules for performing standard circuit design processes such as timing analysis, verification, design rule checking, place and route operations, etc.

Design process 2110 employs and incorporates logic and physical design tools such as HDL compilers and simulation model build tools to process design structure 2120 together with some or all of the depicted supporting data structures along with any additional mechanical design or data (if applicable), to generate a second design structure 2190. Design structure 2190 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 2120, design structure 2190 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1A-1C and 2A-2C. In one embodiment, design structure 2190 may comprise a compiled, executable HDL simulation model that functionally simulates the devices shown in FIGS. 1A-1C and 2A-2C.

Design structure 2190 may also employ a data format used for the exchange of layout data of integrated circuits and/or symbolic data format (e.g. information stored in a GDSII (GDS2), GL1, OASIS, map files, or any other suitable format for storing such design data structures). Design structure 2190 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1A-1C and 2A-2C. Design structure 2190 may then proceed to a stage 2195 where, for example, design structure 2190: proceeds to tape-out, is released to manufacturing, is released to a mask house, is sent to another design house, is sent back to the customer, etc.

Figure 22:
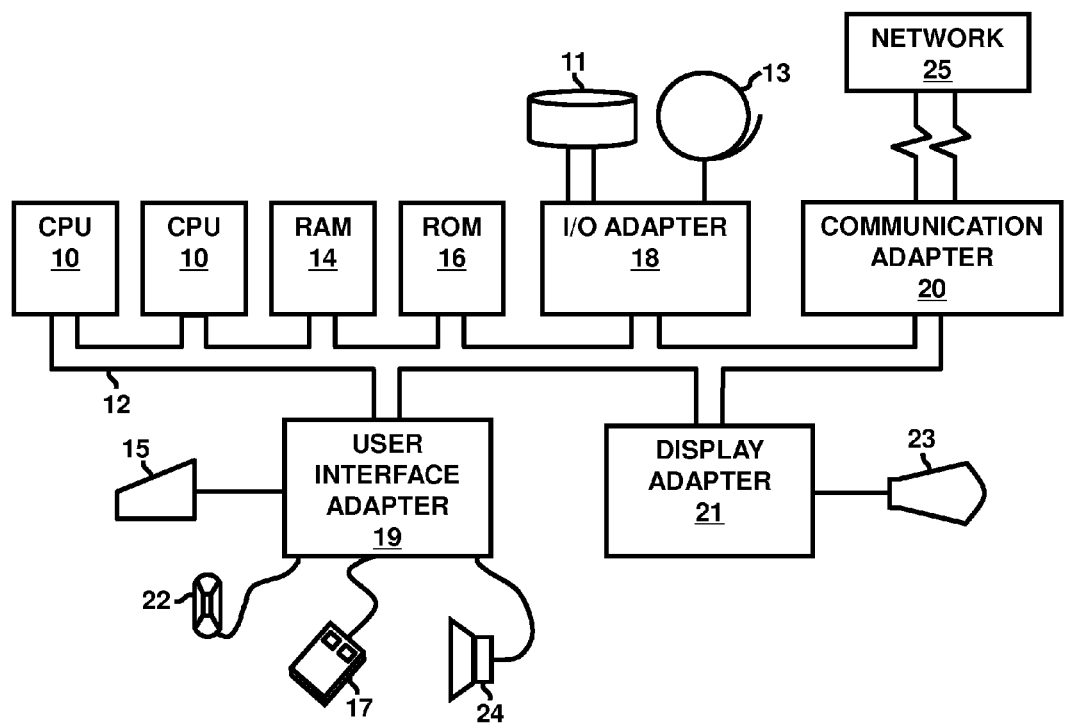
FIG. 22 is schematic diagram illustrating an exemplary computer system that can be used in the implementation of the design flow of FIG. 21.

A representative hardware environment (i.e., a computer system) for implementing the above described design flow is depicted in FIG. 22. This schematic drawing illustrates a hardware configuration of an information handling/computer system in accordance with the embodiments herein. The system comprises at least one processor or central processing unit (CPU) 10. The CPUs 10 are interconnected via a system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments herein. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A field effect transistor comprising:
an insulator layer having a top surface and a cavity at said top surface;
a semiconductor body on said top surface, said semiconductor body having a bottom, a top opposite said bottom and opposing sides, said semiconductor body comprising source/drain regions and a channel region positioned laterally between said source/drain regions, and said semiconductor body traversing said cavity such that said channel region is aligned above said cavity; and,
a gate having a lower portion within said cavity adjacent to said bottom of said semiconductor body at said channel region and an upper portion adjacent to said top and said opposing sides of said semiconductor body at said channel region, said lower portion extending a first distance below said bottom of said semiconductor body, said upper portion extending a second distance above said top of said semiconductor body, and said second distance being less than said first distance.

2. The field effect transistor of claim 1, said gate comprising a replacement metal gate.

3. The field effect transistor of claim 1, said lower portion being approximately equal in length to said upper portion at said top surface of said insulator layer and said_lower portion being longer than said upper portion below said top surface of said insulator layer.

4. The field effect transistor of claim 1, further comprising a gate sidewall spacer laterally surrounding said upper portion and having a lower edge extending vertically into said insulator layer, said cavity and said lower portion increasing in size below said lower edge of said gate sidewall spacer.

5. The field effect transistor of claim 1, said first distance being 1.25 to 5 times greater than said second distance.

6. The field effect transistor of claim 1, said first distance being less than a thickness of said insulator layer.

7. The field effect transistor of claim 1, further comprising an additional insulator layer below said insulator layer, said additional insulator layer having a lower thermal resistance than said insulator layer.

8. A field effect transistor comprising:
an insulator layer having a top surface and a cavity at said top surface;
multiple semiconductor bodies on said top surface, said semiconductor bodies each having a bottom, a top opposite said bottom and opposing sides, said semiconductor bodies each comprising source/drain regions and a channel region positioned laterally between said source/drain regions, and said semiconductor bodies each traversing said cavity such that said said channel region of each of said semiconductor bodies is aligned above said cavity; and,
a gate having a lower portion within said cavity and adjacent to said bottom of each of said semiconductor bodies at said channel region and an upper portion adjacent to said top and said opposing sides of each of said semiconductor bodies at said channel region, said lower portion extending a first distance below said bottom of each of said semiconductor bodies, said upper portion extending a second distance above said top of each of said semiconductor bodies, and said second distance being less than said first distance.

9. The field effect transistor of claim 8, said gate comprising a replacement metal gate.

10. The field effect transistor of claim 8, said lower portion being approximately equal in length to said upper portion at said top surface of said insulator layer and said lower portion being longer than said upper portion below said top surface of said insulator layer.

11. The field effect transistor of claim 8, further comprising a gate sidewall spacer laterally surrounding said upper portion and having a lower edge extending vertically into said insulator layer, said cavity and said lower portion increasing in size below said lower edge of said gate sidewall spacer.

12. The field effect transistor of claim 8, said first distance being 1.25 to 5 times greater than said second distance.

13. The field effect transistor of claim 8, said first distance being less than a thickness of said insulator layer.

14. The field effect transistor of claim 8, said upper portion having first sections adjacent to said semiconductor bodies and second sections between each of said semiconductor bodies, said first sections having a first height and said second sections having a second height that is less than said first height.

15. The field effect transistor of claim 8, further comprising an additional insulator layer below said insulator layer, said additional insulator layer having a lower thermal resistance than said insulator layer.

16. A method of forming a field effect transistor, said method comprising:
- forming a dummy gate adjacent a top and opposing sides of at least one semiconductor body at a channel region, said semiconductor body being on a top surface of an insulator layer and said channel region being positioned laterally between source/drain regions within said semiconductor body;
- forming a dielectric layer over said insulator layer, said source/drain regions of said semiconductor body and said dummy gate;
- selectively removing said dummy gate so as to form, in said dielectric layer, an opening that exposes said top and said opposing sides of said semiconductor body at said channel region and that further exposes portions of said insulator layer adjacent to said opposing sides of said semiconductor body at said channel region;
- etching said portions of said insulator layer so as to form a cavity below a bottom of said semiconductor body at said channel region; and,
- forming a gate having a lower portion within said cavity adjacent to said bottom of said semiconductor body at said channel region and an upper portion within said opening adjacent to said top and said opposing sides of said semiconductor body at said channel region, said lower portion extending a first distance below said bottom of said semiconductor body, said upper portion extending a second distance above said top of said semiconductor body, and said second distance being less than said first distance.

17. The method of claim 16, said forming of said gate comprising:
- forming a gate dielectric adjacent to said bottom, said top and said opposing sides of said semiconductor body; and,
- forming a gate conductor on said gate dielectric so as to fill said cavity and said opening.

18. The method of claim 16, said etching being performed such that said cavity and, thereby said lower portion is approximately equal in length to said opening at said top surface of said insulator layer and further such that said cavity is longer than said opening below said top surface of said insulator layer.

19. The method of claim 16, further comprising:
- before said forming of said dummy gate, recessing said portions of said insulator layer adjacent to said opposing sides of said semiconductor body at said channel region; and,
- after said forming of said dummy gate, forming a gate sidewall spacer that laterally surrounds said dummy gate and has a lower edge extending vertically into said insulator layer, said etching being performed such that said cavity increases in size below said lower edge of said gate sidewall spacer.

20. The method of claim 16, said etching being performed so that said first distance is 1.25 to 5 times greater than said second distance and so that said first distance is less than a thickness of said insulator layer.

* * * * *